(12) United States Patent
Choi et al.

(10) Patent No.: US 12,256,584 B2
(45) Date of Patent: Mar. 18, 2025

(54) DISPLAY DEVICE

(71) Applicant: Samsung Display Co., LTD., Yongin-si (KR)

(72) Inventors: Hae Yun Choi, Yongin-si (KR); Sung Kook Park, Yongin-si (KR); Sung Eun Baek, Yongin-si (KR); Jin Woo Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 477 days.

(21) Appl. No.: 17/546,738

(22) Filed: Dec. 9, 2021

(65) Prior Publication Data
US 2022/0352236 A1 Nov. 3, 2022

(30) Foreign Application Priority Data

Apr. 30, 2021 (KR) .................. 10-2021-0056895
Jun. 4, 2021 (KR) .................. 10-2021-0073060

(51) Int. Cl.
*H01L 27/15* (2006.01)
*H01L 33/38* (2010.01)

(52) U.S. Cl.
CPC ............ *H01L 27/156* (2013.01); *H01L 33/38* (2013.01)

(58) Field of Classification Search
CPC ... H01L 27/156; H01L 33/38; H01L 25/0753; H01L 25/167; H01L 33/24; H01L 33/62; H01L 33/20
See application file for complete search history.

(56) References Cited

U.S. PATENT DOCUMENTS

| | | | |
|---|---|---|---|
| 8,338,832 B2 | 12/2012 | Kim | |
| 9,240,397 B2 * | 1/2016 | Bibl | ............... H01L 27/1244 |
| 10,043,788 B1 * | 8/2018 | Han | ............... H01L 33/48 |
| 10,636,349 B2 | 4/2020 | Shin et al. | |
| 10,714,001 B2 * | 7/2020 | Cok | ............... H01L 27/156 |
| 10,825,393 B2 | 11/2020 | Kim et al. | |
| 11,127,889 B2 * | 9/2021 | Rinne | ............... H01L 23/544 |
| 2009/0315874 A1 | 12/2009 | Kim | |
| 2021/0013259 A1 | 1/2021 | Ahn et al. | |

FOREIGN PATENT DOCUMENTS

| | | |
|---|---|---|
| KR | 10-0729077 | 6/2007 |
| KR | 10-0952814 | 4/2010 |
| KR | 10-2018-0071062 | 6/2018 |
| KR | 10-2018-0118488 | 10/2018 |
| KR | 10-2021-0006241 | 1/2021 |

* cited by examiner

*Primary Examiner* — Elmito Breval
(74) *Attorney, Agent, or Firm* — KILE PARK REED & HOUTTEMAN PLLC

(57) ABSTRACT

A display device includes a pixel, the pixel includes at least one light emitting element including a first end and a second end; a first electrode overlapping the at least one light emitting element and electrically connected to the first end of the at least one light emitting element; and a second electrode overlapping the at least one light emitting element and the first electrode and electrically connected to the second end of the at least one light emitting element, and the first electrode includes area electrodes divided according to a number and a position of area electrodes overlapping the at least one light emitting element.

23 Claims, 21 Drawing Sheets

FIG. 3
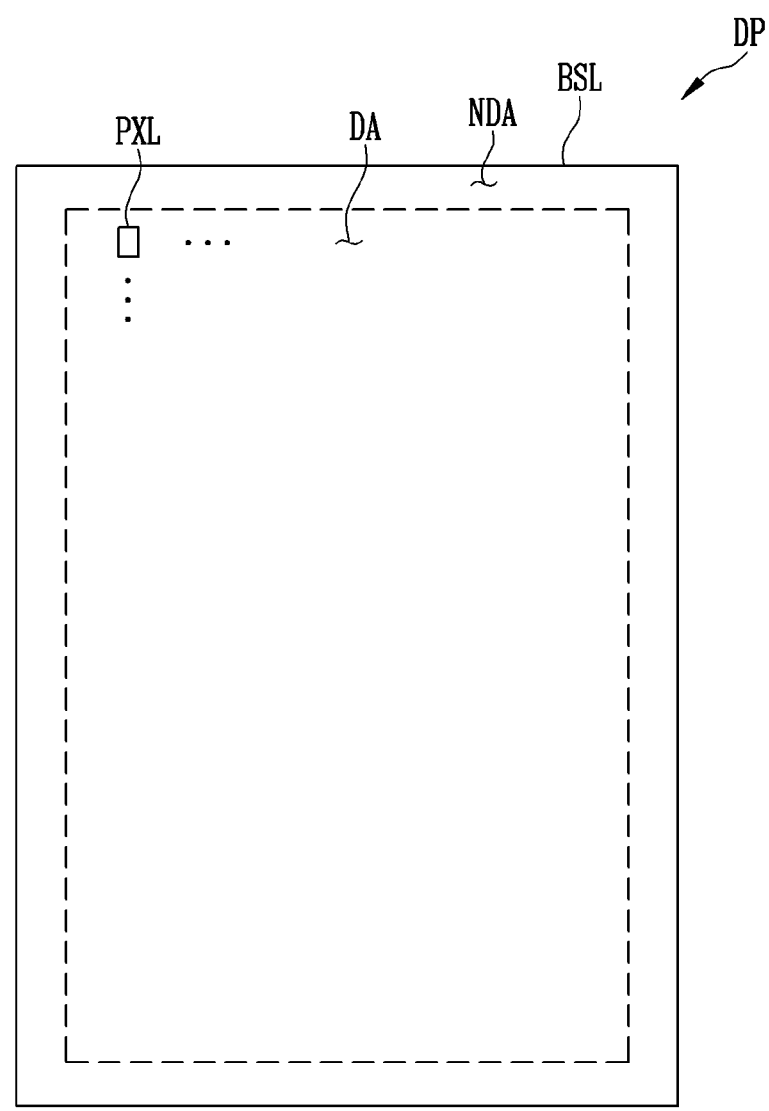
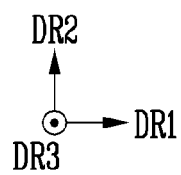

EL1: EL11a, EL11b, EL11c
PXA: PXA11a, PXA11b, PXA11c

170: 170a, 170b

EL1: EL16a, EL16b

DISPLAY DEVICE

CROSS-REFERENCE TO RELATED APPLICATION(S)

This application claims priority to and benefits of Korean Patent Application No. 10-2021-0056895 under 35 U.S.C § 119 filed on Apr. 30, 2021 and Korean Patent Application No. 10-2021-0073060 under 35 U.S.C § 119 filed on Jun. 4, 2021 in the Korean Intellectual Property Office, the entire contents of which are incorporated herein by reference.

BACKGROUND

1. Technical Field

The disclosure relates to a display device.

2. Description of the Related Art

With an increase in interest in an information display and an increase in demand to use portable information media, demand for display devices is markedly increased, and commercialization thereof is in progress.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display device that may minimize a defective range of a pixel and compensate for luminance.

An embodiment provides a display device that may include a pixel, wherein the pixel may include at least one light emitting element including a first end and a second end; a first electrode overlapping the at least one light emitting element and electrically connected to the first end of the at least one light emitting element; and a second electrode overlapping the at least one light emitting element and the first electrode and electrically connected to the second end of the at least one light emitting element, and the first electrode may include area electrodes divided according to a number and a position of area electrodes overlapping the at least one light emitting element.

The pixel may include pixel areas, and the area electrodes may be disposed corresponding to the pixel areas.

The at least one light emitting element may be disposed in a matrix.

The pixel may include a first pixel area, a second pixel area, and a third pixel area; and the first pixel area, the second pixel area, and the third pixel area may be adjacent to each other in a vertical direction.

The first electrode may include a first area electrode, a second area electrode, and a third area electrode; and a number of the at least one light emitting element overlapping the first area electrode may be different from a number of the at least one light emitting element overlapping the second area electrode.

The first area electrode, the second area electrode, and the third area electrode may have a same size or different sizes.

The first area electrode, the second area electrode, and the third area electrode may have a same shape or different shapes.

The pixel may include a first pixel area, a second pixel area, a third pixel area, a fourth pixel area, a fifth pixel area, a sixth pixel area, a seventh pixel area, an eighth pixel area, a ninth pixel area, and a tenth pixel area; and the first pixel area, the second pixel area, the third pixel area, the fourth pixel area, the fifth pixel area, the sixth pixel area, the seventh pixel area, the eighth pixel area, the ninth pixel area, and the tenth pixel area may be disposed to be adjacent in a matrix.

The first electrode may include a first area electrode, a second area electrode, a third area electrode, a fourth area electrode, a fifth area electrode, a sixth area electrode, a seventh area electrode, an eighth area electrode, a ninth area electrode, and a tenth area electrode; and the first area electrode, the second area electrode, the third area electrode, the fourth area electrode, the fifth area electrode, the sixth area electrode, the seventh area electrode, the eighth area electrode, the ninth area electrode, and the tenth area electrode may be spaced apart from each other in a matrix.

The pixel may include a first pixel area and a second pixel area, and the first pixel area and the second pixel area may be adjacent to each other in a horizontal direction.

The first electrode may include a first area electrode and a second area electrode, and a number of the at least one light emitting element overlapping the first area electrode may be equal to a number of the at least one light emitting element overlapping the second area electrode.

The pixel may include a first pixel area and a second pixel area, and the first pixel area and the second pixel area may be adjacent to each other in a vertical direction.

The first electrode may include a first area electrode and a second area electrode, and a number of the at least one light emitting element overlapping the first area electrode may be different from a number of the at least one light emitting element overlapping the second area electrode.

An embodiment provides a display device that may include a pixel, wherein the pixel may include at least one light emitting element including a first end and a second end; a first electrode overlapping the at least one light emitting element and electrically connected to the first end of the at least one light emitting element; and a second electrode overlapping the at least one light emitting element and the first electrode and electrically connected to the second end of the at least one light emitting element, and the first electrode may include area electrodes divided according to a number and a position of area electrodes overlapping the at least one light emitting element; the pixel may include pixel areas, and the area electrodes may be disposed corresponding to the pixel areas; and the at least one light emitting element may be disposed in a zigzag pattern.

The first electrode may include a first area electrode, a second area electrode, and a third area electrode; and the first area electrode, the second area electrode, and the third area electrode may be spaced apart from each other in a vertical direction.

A number of the at least one light emitting element overlapping the first area electrode may be different from a number of the at least one light emitting element overlapping the second area electrode.

The pixel areas may be adjacent in a matrix; the area electrodes may be spaced apart from each other in a matrix; and the at least one light emitting element may overlap a number of the area electrodes.

The first electrode may include a first area electrode and a second area electrode; and the first area electrode and the second area electrode may be spaced apart from each other in a horizontal direction.

The first electrode may include a first area electrode and a second area electrode, and the first area electrode and the second area electrode may be \spaced apart from each other in a vertical direction.

A number of the at least one light emitting element overlapping the first area electrode may be different from a number of the at least one light emitting element overlapping the second area electrode.

An embodiment provides a display device that may include pixels, wherein each of the pixels may include at least one light emitting element including a first end and a second end; and a first electrode overlapping the at least one light emitting element and electrically connected to the first end of the at least one light emitting element, and the first electrode may include area electrodes divided according to a number and a position of area electrodes overlapping the at least one light emitting element; and a distance between the area electrodes may be smaller than a diameter of the at least one light emitting element.

The pixels may include a first pixel and a second pixel, and a distance between the first electrode of the first pixel and the first electrode of the second pixel may be greater than a diameter of the at least one light emitting element.

The display device may further include an insulating layer disposed between the area electrodes.

The display device may further include an auxiliary adhesive layer disposed on the first electrode and the insulating layer.

According to an embodiment, an area of one pixel is divided into areas, and an anode is divided and disposed in each area, so that in case that a pixel is defective, the remaining area except for a defective area may be normally driven. Accordingly, it is possible to minimize a defective range in one pixel area and compensate for luminance.

Effects of an embodiment are not limited by what is illustrated in the above, and more various effects are included in the specification.

BRIEF DESCRIPTION OF THE DRAWINGS

The above and other aspects and features of the disclosure will become more apparent by describing in detail embodiments thereof with reference to the attached drawings, in which:

FIG. 3 illustrates a schematic top plan view of a display panel according to an embodiment.

DETAILED DESCRIPTION OF THE EMBODIMENTS

Figure 1:
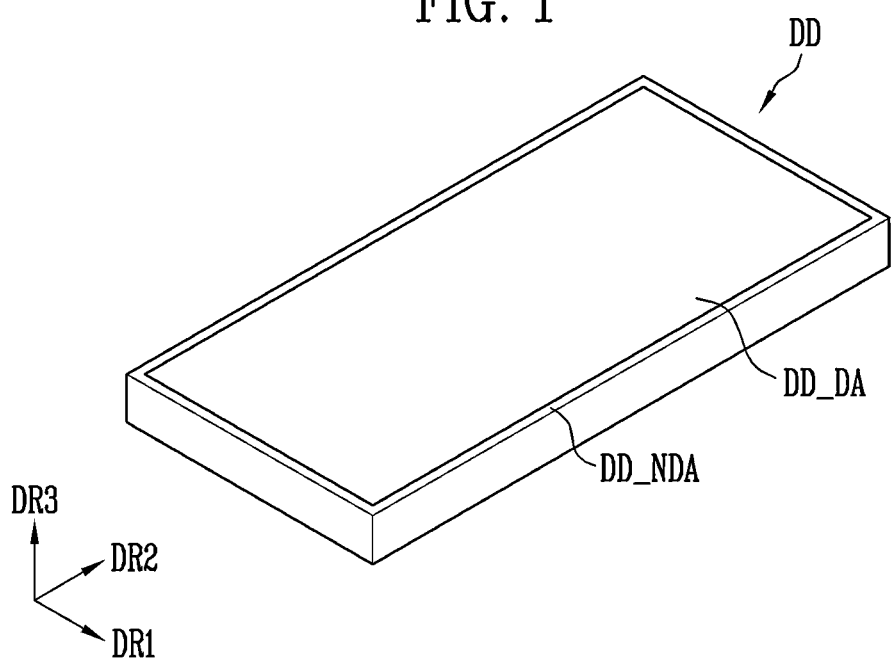
FIG. 1 illustrates a schematic perspective view of a display device according to an embodiment.
Figure 2:
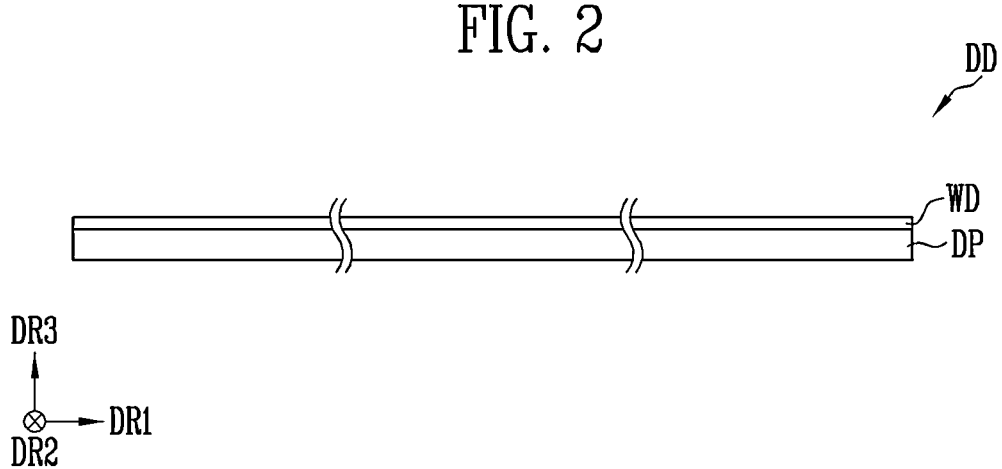
FIG. 2 illustrates a schematic cross-sectional view of the display device of FIG. 1.
Figure 4:
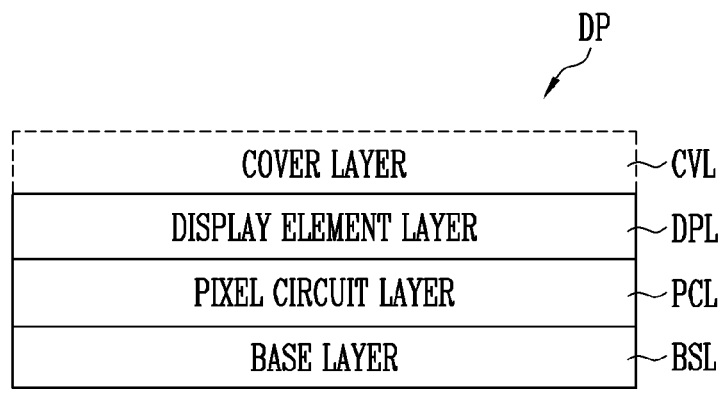
FIG. 4 illustrates a schematic cross-sectional view of a display panel according to an embodiment.

Since the disclosure may be variously modified and have various forms, embodiments will be illustrated and described in detail in the following. This, however, by no means restricts the disclosure to the described embodiments, and it is to be understood as embracing all included in the spirit and scope of the disclosure changes, equivalents, and substitutes.

In the drawings, sizes, thicknesses, ratios, and dimensions of the elements may be exaggerated for ease of description and for clarity. Like numbers refer to like elements throughout.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

Terms such as first, second, and the like will be used to describe various constituent elements, and are not to be interpreted as limiting these constituent elements. The terms are only used to differentiate one constituent element from other constituent elements. For example, a first constituent element could be termed a second constituent element, and similarly, a second constituent element could be termed as a first constituent element, without departing from the scope of the disclosure. Singular forms are intended to include plural forms unless the context clearly indicates otherwise.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

In the application, it should be understood that the term "include", "comprise", "have", or "configure" and variations thereof indicates that a feature, a number, a step, an operation, a constituent element, a part, or a combination thereof described in the specification is present, but does not exclude a possibility of presence or addition of one or more other features, numbers, steps, operations, constituent elements, parts, or combinations, in advance.

It will be understood that when an element such as a layer, film, region, area, or substrate is referred to as being "on" another element, it can be directly on the other element or intervening elements may also be present. In addition, in the specification, when a portion of a layer, film, region, area, plate, or the like is referred to as being formed "on" another portion, the formed direction is not limited to an upper direction but includes a lateral or lower direction. In contrast, when an element of a layer, film, region, plate, or the like is referred to as being "below" another element, it may be directly below the other element, or intervening elements may be present.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display device according to an embodiment will be described with reference to drawings related to an embodiment.

Referring to FIG. 1 to FIG. 4, a display device DD may include a display panel DP and a window WD.

The display device DD may include a display area DD_DA that displays an image and a non-display area DD NDA that does not display an image. The non-display area DD NDA may be provided on at least one side or a side of the display area DD_DA, and may be provided to surround or to be adjacent to the display area DD_DA. In an embodiment, a shape of the display area DD_DA and a position of the non-display area DD NDA may be relatively designed.

The display device DD may be provided in a form of a plate having a substantially rectangular shape with substantially angled corners, but in an embodiment, the display device DD may be realized in a form of a plate having a substantially rectangular shape with substantially rounded corners. The disclosure is not limited thereto, and the display device DD may be implemented in various shapes.

The display device DD according to an embodiment may be applied to an electronic device in which a display surface is applied to at least one surface or a surface thereof such as a smart phone, a television, a tablet PC, a mobile phone, an image phone, an electron book reader, a desktop PC, a laptop PC, a netbook computer, a workstation, a server, a PDA, a portable multimedia player (PMP), an MP3 player, a medical device, a camera, or a wearable display device.

The display panel DP is an area that displays an image. The display panel DP may be realized as a self-emission display panel such as an organic light emitting display (OLED) panel, a nano-scale LED display panel, and a quantum dot organic light emitting display (QD OLED) panel.

The display panel DP may include a base layer BSL and pixels PXL disposed on the base layer BSL.

The base layer BSL may form a base member of the display device DD. In an embodiment, the base layer BSL may be a rigid or flexible substrate or film, and its material or physical properties are not particularly limited. For example, the base layer BSL may be formed as a rigid substrate made of glass or tempered glass, as a flexible substrate (or a thin film) made of a plastic or metallic material, or as at least one layer or a layer of insulating film, but its material and/or physical properties are not particularly limited.

The base layer BSL may include a display area DA that displays an image and a non-display area NDA excluding the display area DA. The non-display area NDA is an area in which no image is displayed, and may be a bezel area surrounding or adjacent to the display area DA. Here, the display area DA of the display panel DP may correspond to the display area DD_DA of the display device DD, and the non-display area NDA of the display panel DP may be correspond to the non-display area DD NDA of the display device DD.

The display area DA may be disposed on one surface or a surface of the display panel DP. For example, the display area DA may be disposed on a front side of the display panel DP, and may additionally be disposed on a side or rear surface of the display panel DP.

The non-display area NDA may be disposed around the display area DA to surround or to be adjacent to the display area DA. The non-display area NDA may selectively include wires, pads, and a driving circuit connected to the pixels PXL of the display area DA.

In FIG. 3, only one pixel PXL is illustrated, but pixels PXL may be substantially dispersed and disposed in the display area DA. For example, the pixels PXL may be disposed in the display area DA to have an arrangement structure such as a matrix or stripe. However, the disclosure is not limited thereto.

The display panel DP may include a pixel circuit layer PCL, a display element layer DPL, and a cover layer CVL that may be sequentially disposed on the base layer BSL.

The pixel circuit layer PCL may be disposed on the base layer BSL, and may include transistors and signal lines connected to the transistors. For example, each transistor may have a structure in which a semiconductor pattern, a gate electrode, a source electrode, and a drain electrode may be sequentially stacked each other with an insulating layer interposed therebetween.

The display element layer DPL may be disposed on the pixel circuit layer PCL, and may include light emitting elements. For example, the light emitting element may be an organic light emitting diode, an inorganic light emitting element, or a light emitting element that emits light by changing a wavelength of light emitted by using quantum dots.

The cover layer CVL may be disposed on the display element layer DPL. The cover layer CVL may be an encapsulation substrate or a multi-layered encapsulation film. In case that the cover layer CVL is in the form of an encapsulation film, it may have a structure in which an inorganic film, an organic film, and an inorganic film may be sequentially stacked each other. The cover layer CVL may prevent external air and moisture from penetrating into the display element layer DPL and the pixel circuit layer PCL.

In an embodiment, the cover layer CVL may be made of a heat and/or photo-curable resin and coated on the base layer BSL in a liquid form, and cured by a curing process using heat and/or light. The cover layer CVL may protect the light emitting element and stably fix the light emitting element.

The window WD for protecting an exposed surface of the display panel DP may be provided on the display panel DP. The window WD may protect the display panel DP from external impact, and may provide an input surface and/or a display surface to a user. The window WD may be combined with the display panel DP by using an optically clear adhesive member.

The window WD may have a multi-layered structure selected from a glass substrate, a plastic film, and a plastic substrate. Such a multi-layered structure may be formed through a continuous process or an adhesive process using an adhesive layer. The window WD may be entirely or partially flexible.

A touch sensor may be disposed between the display panel DP and the window WD. The touch sensor may be disposed on or directly disposed on a surface of the display panel DP on which an image is displayed to receive a user's touch input.

Hereinafter, a pixel included in a display device or display panel according to an embodiment will be described with reference to FIG. 5.

Figure 5:
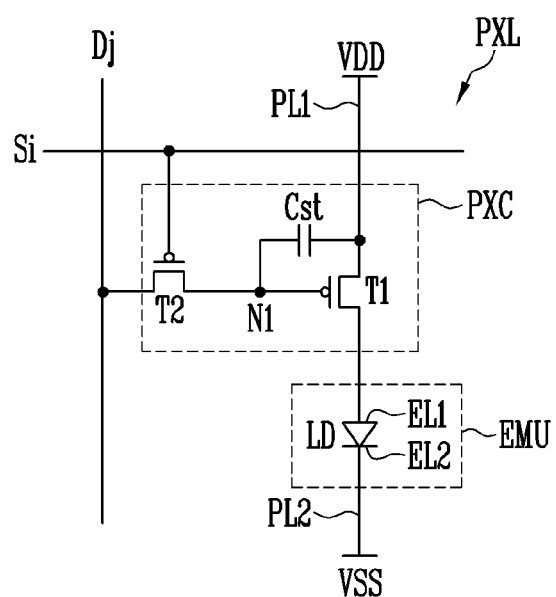
FIG. 5 illustrates a schematic diagram of an equivalent circuit of an electrical connection relationship of one pixel included in a display device according to an embodiment.

FIG. 5 illustrates a schematic diagram of an equivalent circuit of an electrical connection relationship of one pixel included in a display device according to an embodiment.

Referring to FIG. 5, one pixel PXL may include at least one light emitting unit EMU that generates luminance light corresponding to a data signal. One pixel PXL may further selectively include a pixel circuit PXC for driving the light emitting unit EMU.

The light emitting unit EMU may include a light emitting element LD connected between a first power line PL1 to which a voltage of a first driving power source VDD is applied and a second power line PL2 to which a voltage of a second driving power source VSS is applied.

For example, the light emitting unit EMU may include a first electrode EL1 connected to the first power source VDD via the pixel circuit PXC and the first power line PL1, a second electrode EL2 connected to the second power source VSS via the second power line PL2, and light emitting elements LD connected between the first electrode EL1 and the second electrode EL2. In an embodiment, the first electrode EL1 may be an anode, and the second electrode EL2 may be a cathode.

The light emitting element LD included in the light emitting unit EMU may include one end (or first end) connected to the first driving power source VDD through the first electrode EL1 and the other end (or second end) connected to the second driving power source VSS through the second electrode EL2.

The first driving power source VDD and the second driving power source VSS may have different potentials. For example, the first driving power source VDD may be set as a high potential power source, and the second driving power source VSS may be set as a low potential power source. A potential difference between the first driving power source VDD and the second driving power source VSS may be set to be equal to or higher than a threshold voltage of the light emitting element LD during a light emitting period of the pixel PXL.

The light emitting element LD of the light emitting unit EMU may emit light with luminance corresponding to a driving current supplied through the pixel circuit PXC. For example, during each frame period, the pixel circuit PXC may supply a driving current corresponding to a gray value of one frame data to the light emitting unit EMU. The driving current supplied to the light emitting unit EMU may flow in the light emitting element LD.

One light emitting element LD is shown in FIG. 5, but the disclosure is not limited thereto. In an embodiment, the light emitting unit EMU may include light emitting elements that are connected to each other in parallel in a same direction between the first electrode EL1 and the second electrode EL2, and the light emitting elements may form a series/parallel mixed structure connected in n series stages.

The pixel circuit PXC is connected to a scan line Si and a data line Dj of one pixel PXL. For example, in case that the pixel PXL may be disposed in an i-th (i is a natural number) row and a j-th (j is a natural number) column of the display area DA (see FIG. 3), the pixel circuit PXC of the pixel PXL may be connected to an i-th scan line Si and a j-th data line Dj of the display area DA.

The pixel circuit PXC may include a first transistor T1, a second transistor T2, and a storage capacitor Cst.

A first terminal of the first transistor T1 (or driving transistor) is connected to the first driving power supply source VDD, and a second terminal thereof is electrically connected to the first electrode EL1 of the light emitting unit EMU. A gate electrode of the first transistor T1 is connected to a first node N1. Accordingly, the first transistor T1 may control an amount of driving current supplied to the light emitting element LD in response to a voltage of the first node N1.

A first terminal of the second transistor T2 (or switching transistor) is connected to the data line Dj, and a second terminal thereof is connected to the first node N1. A gate electrode of the second transistor T2 is connected to the scan line Si. The second transistor T2 is turned on in case that a scan signal (low level) of a turn-on voltage is supplied from the scan line Si, and electrically connects the data line Dj and the first node N1. In case that a data signal of one frame is supplied to the data line Dj, the data signal is transmitted to the first node N1. The data signal transmitted to the first node N1 is charged in the storage capacitor Cst.

One electrode of the storage capacitor Cst is connected to the first node N1, and the other electrode thereof is connected to the first terminal of the first transistor T1. The storage capacitor Cst may be charged with a voltage corresponding to a voltage difference between a voltage corresponding to a data signal supplied to the first node N1 and a voltage of the first terminal of the first transistor T1, and it may maintain the charged voltage until a data signal of a subsequent frame is supplied.

FIG. 5 illustrates an embodiment in which both the first transistor T1 and the second transistor T2 are P-type transistors, but the disclosure is not limited thereto. In an embodiment, at least one of the first transistor T1 and the second transistor T2 may be changed to an N-type transistor.

The structure of the pixel circuit PXC of FIG. 5 may be variously changed. For example, the pixel circuit PXC may additionally include other circuit elements such as a transistor for compensating a threshold voltage of the first transistor T1, a transistor for initializing a voltage of the first node N1, a transistor for controlling a light emitting time of the light emitting element LD, and a boosting capacitor for boosting a voltage of the first node N1.

Hereinafter, a light emitting element included in a display device and a pixel according to an embodiment will be described with reference to FIG. 6 and FIG. 7.

Figure 6:
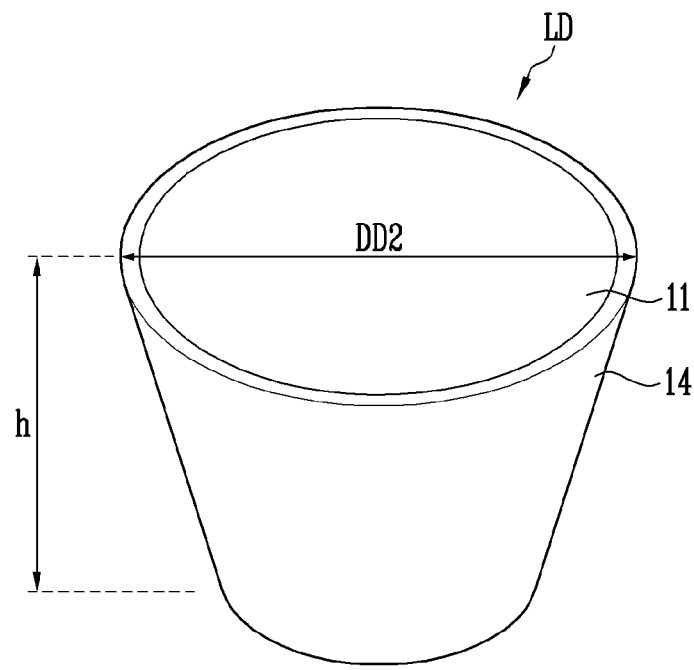
FIG. 6 illustrates a schematic perspective view of a light emitting element included in a display device according to an embodiment.
Figure 7:
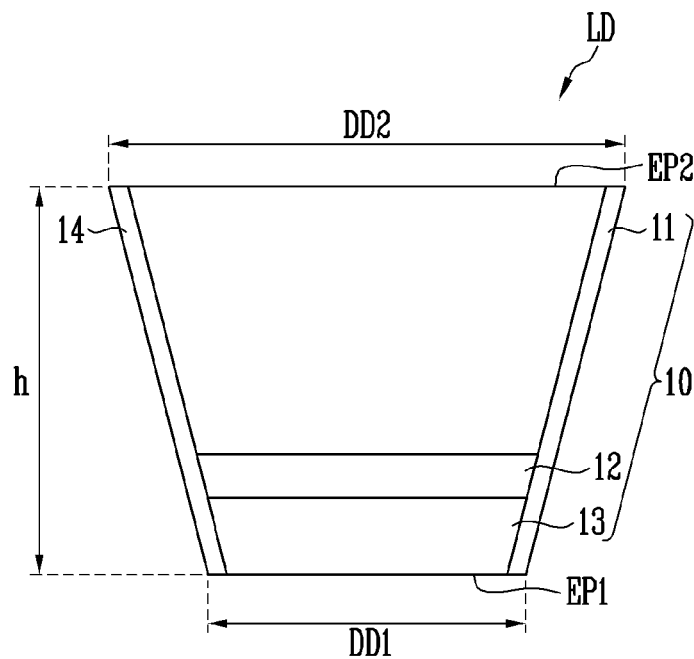
FIG. 7 illustrates a schematic cross-sectional view of a light emitting element included in a display device according to an embodiment.

FIG. 6 illustrates a schematic perspective view of a light emitting element included in a display device according to an embodiment, and FIG. 7 illustrates a schematic cross-sectional view of a light emitting element included in a display device according to an embodiment.

Referring to FIG. 6 and FIG. 7, the light emitting element LD may include a first semiconductor layer 11, an active layer 12, and a second semiconductor layer 13. For example, the light emitting element LD may be a light emitting stacked body 10 in which the first semiconductor layer 11, the active layer 12, and the second semiconductor layer 13 may be sequentially stacked each other. In an embodiment, the light emitting element LD may further include a bonding electrode layer, and the bonding electrode layer may be stacked each other on one surface or a surface of the first semiconductor layer 11 or one surface or a surface of the second semiconductor layer 13.

In a height h direction of the light emitting element LD, a lower surface may be referred to as a first end EP1, and an upper surface may be referred to as a second end EP2.

The light emitting element LD may have a substantially column shape in which a diameter DD1 of the first end EP1 and a diameter DD2 of the second end EP2 are different from each other. For example, the light emitting element LD may have or disposed a column shape in which the diameter DD1 of the first end EP1 may be smaller than the diameter DD2 of the second end EP2. For example, the light emitting element LD may have a substantially elliptical column shape in which a diameter increases toward an upper portion along the height h direction.

The disclosure is not limited thereto, and in an embodiment, the light emitting element LD may have a substantially column shape in which the diameter DD1 of the first end EP1 is larger than the diameter DD2 of the second end EP2. an embodiment, the light emitting element LD may have a substantially elliptical column shape in which a diameter decreases toward an upper portion along the height h direction.

In an embodiment, shapes of the first end EP1 and the second end EP2 of the light emitting element LD may be a polygon such as a rectangle, a square, an equilateral triangle, or a regular pentagon. In an embodiment, the light emitting element LD may have a substantially truncated pyramid shape in which an area of an upper surface thereof and an area of a lower surface thereof are different from each other.

The light emitting element LD may have a size of a nano-scale to a micro-scale. However, the size of the light emitting element LD is not limited thereto, and the size of the light emitting element LD may be variously changed according to design conditions of various devices (for example, a display device) using a light emitting device using the light emitting element LD as a light source.

The first semiconductor layer 11 may be a semiconductor layer of first conductivity (or type). For example, the first semiconductor layer 11 may include at least one N-type semiconductor. For example, the first semiconductor layer 11 may include a semiconductor material of one of InAlGaN, GaN, AlGaN, InGaN, AlN, and InN, and may include an N-type semiconductor layer doped with a first conductive dopant such as Si, Ge, Sn, or the like within the spirit and the scope of the disclosure. However, the material included in the first semiconductor layer 11 is not limited thereto, and the first semiconductor layer 11 may be made of various materials.

The active layer 12 may be disposed on one surface or a surface of the first semiconductor layer 11. The active layer 12 may be disposed on the first semiconductor layer 11. The active layer 12 may have a single or multiple quantum well structure. In an embodiment, a clad layer doped with a conductive dopant may be formed at an upper portion and/or a lower portion of the active layer 12. For example, the clad layer may be formed as an AlGaN layer or an InAlGaN layer. In an embodiment, a material such as AlGaN and InAlGaN may be used to form the active layer 12, and in addition, various materials may form the active layer 12.

In case that a voltage of a threshold voltage or more is applied to the upper surface and the lower surface of the light emitting element LD, the light emitting device LD emits light while electron-hole pairs are combined in the active layer 12. By controlling the light emission of the light emitting element LD by using this principle, it may be used as a light source for various light emitting devices in addition to pixels of a display device.

The second semiconductor layer 13 may be disposed on one surface or a surface of the active layer 12. The second semiconductor layer 13 may be disposed on the active layer 12. The second semiconductor layer 13 may include a semiconductor layer having a conductivity (or type) different from that of the first semiconductor layer 11. For example, the second semiconductor layer 13 may include at least one P-type semiconductor layer. For example, the second semiconductor layer 13 may include at least one semiconductor material of InAlGaN, GaN, AlGaN, InGaN, AlN, and InN, and may include a p-type semiconductor layer doped with a second conductive dopant such as Mg, Zn, Ca, Sr, or Ba. However, the material included in the second semiconductor layer 13 is not limited thereto, and the second semiconductor layer 13 may be formed of various materials.

It is illustrated that each of the first semiconductor layer 11 and the second semiconductor layer 13 are formed as one layer or a layer, but the disclosure is not limited thereto. In an embodiment, each of the first semiconductor layer 11 and the second semiconductor layer 13 may further include at least one or more layers, for example, a cladding layer and/or a tensile strain barrier reducing (TSBR) layer according to the material of the active layer 12. The TSBR layer may be a strain reducing layer disposed between semiconductor layers having different lattice structures and serving as a buffer to reduce a difference in lattice constant. The TSBR layer may be formed of a p-type semiconductor layer such as p-GaInP, p-AlInP, or p-AlGaInP, but the disclosure is not limited thereto.

In an embodiment, the light emitting element LD may further include an electrode disposed on the upper portion of the first semiconductor layer 11 and/or the lower portion the second semiconductor layer 13 in addition to the first semiconductor layer 11, the active layer 12, and second semiconductor layer 13 described above.

The electrode may be an ohmic contact electrode, but the disclosure is not limited thereto. In an embodiment, the electrode may be a schottky contact electrode. The electrode may include a conductive material. For example, the electrodes may include an opaque metal in which chromium (Cr), titanium (Ti), aluminum (Al), gold (Au), nickel (Ni), and an oxide or alloy thereof are used alone or in combination, but the disclosure is not limited thereto. In an embodiment, the electrodes may include a transparent conductive oxide such as an indium tin oxide (ITO), an indium zinc oxide (IZO), a zinc oxide (ZnO), an indium gallium zinc oxide (IGZO), and an indium tin zinc oxide (ITZO). The electrode may be a portion in direct contact with an anode or a cathode.

In an embodiment, the light emitting element LD may further include an insulating film 14. In an embodiment, the insulating film 14 may be omitted, and may be provided to cover or overlap only a portion of the light emitting stacked body 10.

The insulating film 14 may prevent an electrical short circuit that may occur in case that the active layer 12 contacts conductive materials other than the first and second semiconductor layers 11 and 13. The insulating film 14 may minimize surface defects of the light emitting element LD to improve lifespan and luminous efficiency of the light emitting element LD. In case that the light emitting elements LD are closely disposed, the insulating film 14 may prevent unwanted short circuits that may occur between the light emitting elements LD. As long as the active layer 12 may prevent a short circuit with an external conductive material from being caused, whether or not the insulating film 14 is provided is not limited.

The light emitting element LD may further include a reflective member (not shown) surrounding an outer circumferential surface of the insulating film 14. The reflective member may be made of a material having a reflectivity in order to focus light emitted from the light emitting element LD to a specific or a given area while proceeding in an image display direction. For example, the reflective member may be made of a conductive material (or substance) having a reflectivity.

Hereinafter, a structure of a display device according to an embodiment will be described with reference to FIG. 8.

Figure 8:
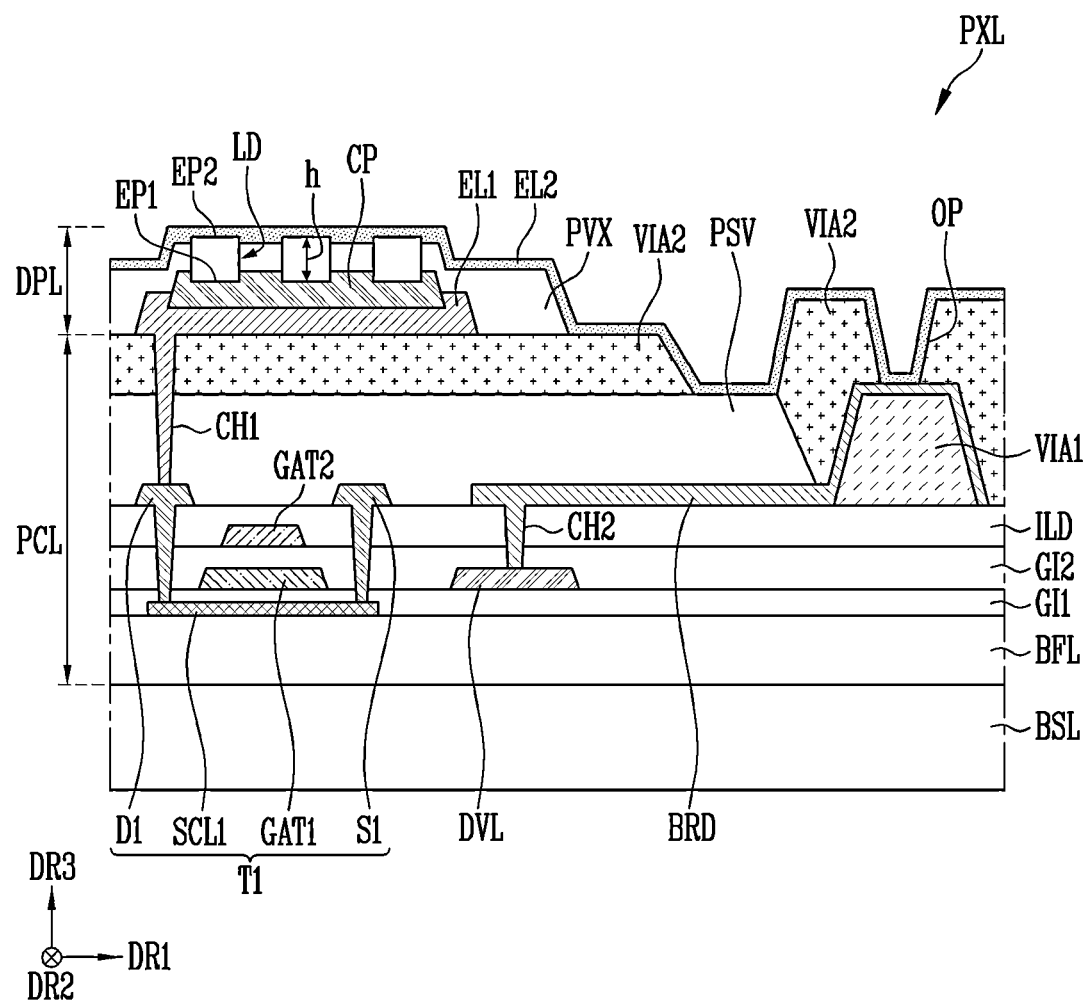
FIG. 8 illustrates a schematic cross-sectional view of a pixel included in a display device according to an embodiment.

FIG. 8 illustrates a schematic cross-sectional view of a pixel included in a display device according to an embodiment.

Referring to FIG. 8, one pixel PXL included in the display device according to an embodiment may include the base layer BSL, the pixel circuit layer PCL, and the display element layer DPL.

The base layer BSL may be a rigid or flexible substrate. For example, in case that the base layer BSL is a rigid substrate, the base layer BSL may be implemented with a glass substrate, a quartz substrate, a glass ceramic substrate, a crystalline glass substrate, or the like within the spirit and the scope of the disclosure. In case that the base layer BSL is a flexible substrate, the base layer BSL may be implemented with a polymer organic material substrate including polyimide, polyamide, and the like, a plastic substrate, or the like within the spirit and the scope of the disclosure.

The pixel circuit layer PCL may be disposed on the base layer BSL.

The pixel circuit layer PCL may include at least one transistor and wires connected to the at least one transistor. The pixel circuit layer PCL may include a buffer layer BFL, a first gate insulating layer GI1, a second gate insulating layer GI2, an interlayer insulating layer ILD, a first via layer VIA1, and a second via layer VIA2 that may be sequentially stacked each other on one surface or a surface of the base layer BSL.

The buffer layer BFL may be disposed on the base layer BSL to cover or overlap the base layer BSL. The buffer layer BFL may prevent impurities from being diffused into the pixel circuit layer PCL from the outside. The buffer layer BFL may include at least one of metal oxides such as a silicon nitride ($SiN_x$), a silicon oxide ($SiO_x$), a silicon oxynitride ($SiO_xN_y$), and an aluminum oxide ($AlO_x$). In an embodiment, the buffer layer BFL may be omitted. A lower metal layer may be disposed between the base layer BSL and the buffer layer BFL.

A first transistor T1 may include a first semiconductor pattern SCL1, a first gate electrode GAT1, a first source electrode S1, and a first drain electrode D1.

The first semiconductor pattern SCL1 may be disposed on the buffer layer BFL. The first semiconductor pattern SCL1 may include a channel region, and a source region and a drain region disposed at both sides of the channel region. The source region of the first semiconductor pattern SCL1 may be electrically connected to the first source electrode S1, and the drain region thereof may be electrically connected to the first drain electrode D1. The source region and the drain region may be expanded to be electrically connected to electrodes of different layers through contact holes, respectively.

The first semiconductor pattern SCL1 may include at least one of polysilicon, amorphous silicon, and an oxide semiconductor.

The first gate insulating layer GI1 may be disposed on the first semiconductor pattern SCL1 and the buffer layer BFL. The first gate insulating layer GI1 covers or overlaps the first semiconductor pattern SCL1 and the buffer layer BFL.

The first gate insulating layer GI1 may include an inorganic material. For example, the first gate insulating layer GI1 may include at least one of a silicon nitride ($SiN_x$), a silicon oxide ($SiO_x$), a silicon oxynitride ($SiO_xN_y$), and an aluminum oxide ($AlO_x$). In an embodiment, the first gate insulating layer GI1 may include an organic material.

The first gate electrode GAT1 may be disposed on the first gate insulating layer GI1. The first gate electrode GAT1 may be disposed to overlap the channel region of the first semiconductor pattern SCL1.

A driving voltage wire DVL may be disposed on the first gate insulating layer GI1. Here, the driving voltage wire DVL may correspond to a portion of the second power line PL2 of FIG. 5 described above. The driving voltage wire DVL may be physically and/or electrically connected to a bridge electrode BRD through a second contact hole CH2. Since the bridge electrode BRD may be physically and/or electrically connected to the second electrode EL2, the driving voltage wire DVL may transmit a voltage of the second driving power source VSS (see FIG. 5) to the second electrode EL2 through the bridge electrode BRD. The driving voltage wire DVL is shown to be disposed on a same layer as the first gate electrode GAT1, but the disclosure is not limited thereto.

The second gate insulating layer GI2 may be disposed on the first gate electrode GAT1 and the first gate insulating layer GI1. The second gate insulating layer GI2 covers or overlaps the first gate electrode GAT1 and the first gate insulating layer GI1.

The second gate insulating layer GI2 may include the same material or a similar material as the first gate insulating layer GI1, and for example, it may include at least one of a silicon nitride ($SiN_x$), a silicon oxide ($SiO_x$), a silicon oxynitride ($SiO_xN_y$), and an aluminum oxide ($AlO_x$).

The second gate electrode GAT2 may be disposed on the second gate insulating layer GI2. The second gate electrode GAT2 may be disposed to overlap the first gate electrode GAT1. Accordingly, the first gate electrode GAT1 and the second gate electrode GAT2 overlapping each other including the second gate insulating layer GI2 therebetween may compose one capacitor.

The interlayer insulating layer ILD may be disposed on the second gate insulating layer GI2. The interlayer insulating layer ILD covers or overlaps the second gate insulating layer GI2. The interlayer insulating layer ILD may include the same material or a similar material as the second gate insulating layer GI2, and may include an inorganic material or an organic material.

The first source electrode S1 and the first drain electrode D1 are disposed on the interlayer insulating layer ILD. Here, the first source electrode S1 may have a same configuration as the first terminal of the first transistor T1 of FIG. 5 described above, and the first drain electrode D1 may have a same configuration as the second terminal of the first transistor T1.

The first drain electrode D1 may be electrically connected to the first electrode EL1 of the display element layer DPL through a passivation layer PSV to be described later and a first contact hole CH1 of the second via layer VIA2. Accordingly, the first transistor T1 may transmit a voltage of the first driving power source VDD (see FIG. 5) to the first electrode EL1.

The first via layer VIA1 may be disposed on the interlayer insulating layer ILD. The first via layer VIA1 covers or overlaps a portion of the interlayer insulating layer ILD. Here, the first via layer VIA1 may be referred to as a dam structure partitioning a light emitting area, a pixel defining film, and a bank.

The first via layer VIA1 may include at least one organic insulating layer. The first via layer VIA1 may be a single film or a multi-film, and may include an inorganic insulating material and an organic insulating material. For example, the first via layer VIA1 may include at least one of a polyacrylates resin, an epoxy resin, a phenolic resin, a polyamides resin, and a polyimides resin.

The bridge electrode BRD may be disposed on the interlayer insulating layer ILD and the first via layer VIA1. The bridge electrode BRD may be disposed to be bent in a third direction DR3 along a shape of the first via layer VIA1. The bridge electrode BRD may be physically and/or electrically connected to the driving voltage wire DVL through the second contact hole CH2 of the second gate insulating layer GI2 and the interlayer insulating layer ILD. The bridge electrode BRD is shown to be disposed on a same layer as the first source electrode S1 and the first drain electrode D1 of the first transistor T1, but the disclosure is not limited thereto.

The passivation layer PSV may be disposed on the first source electrode S1, the first drain electrode D1, the interlayer insulating layer ILD, and the bridge electrode BRD. The passivation layer PSV may entirely cover or overlap the first source electrode S1 and the first drain electrode D1, and may partially cover or overlap the interlayer insulating layer ILD and the bridge electrode BRD.

The passivation layer PSV may include an organic insulating film, an inorganic insulating film, or the organic insulating film disposed on the inorganic insulating film. For example, the inorganic insulating film may include at least one of metal oxides such as a silicon oxide ($SiO_x$), a silicon nitride ($SiN_x$), a silicon oxynitride ($SiO_xN_y$), and an aluminum oxide ($AlO_x$). For example, the organic insulating film may include at least one of a polyacrylates resin, an epoxy resin, a phenolic resin, a polyamides resin, a polyimides rein, an unsaturated polyesters resin, a poly-phenylen ethers resin, a poly-phenylene sulfides resin, and a benzocyclobutene resin.

The second via layer VIA2 may be disposed on the passivation layer PSV and the bridge electrode BRD. The second via layer VIA2 may partially cover or overlap the passivation layer PSV and the bridge electrode BRD to have at least one opening OP. In the opening OP of the second via layer VIA2 partially exposing an upper surface of the bridge electrode BRD, the second electrode EL2 and the bridge electrode BRD may be physically and/or electrically connected. Here, the second via layer VIA2 may be referred to as a dam structure partitioning a light emitting area together with the first via layer VIA1, a pixel defining layer, and a bank.

A portion of the second via layer VIA2 may be disposed on the display element layer DPL according to a height of the upper surface of the second via layer VIA2 formed along the third direction DR3. The second electrode EL2 may be disposed on the upper surface of the second via layer VIA2 disposed on the display element layer DPL.

The second via layer VIA2 may include at least one organic insulating layer. The second via layer VIA2 may be a single film or a multi-film, and may include an inorganic insulating material and an organic insulating material. For example, the second via layer VIA2 may include at least one of a polyacrylates resin, an epoxy resin, a phenolic resin, a polyamides resin, and a polyimides resin.

The display element layer DPL may include the first electrode EL1, a bonding electrode CP, the light emitting elements LD, a protective layer PVX, and the second electrode EL2.

The first electrode EL1 may be disposed on the second via layer VIA2. The first electrode EL1 may be disposed on the pixel circuit layer PCL.

The first electrode EL1 may be electrically connected to the first end EP1 of each of the light emitting elements LD. The first electrode EL1 may be electrically connected to the first transistor T1 of the pixel circuit layer PCL through the first contact hole CH1. Here, the first electrode EL1 may be an anode.

The first electrode EL1 may include a transparent conductive material having a reflectivity. For example, the first electrode EL1 may include a conductive oxide such as an indium tin oxide (ITO), an indium zinc oxide (IZO), a zinc oxide (ZnO), an indium gallium zinc oxide (IGZO), or an indium tin zinc oxide (ITZO), and a conductive polymer such as poly(3,4-ethylenedioxythiophene (PEDOT). The first electrode EL1 may include an opaque metal advantageous for reflecting light emitted from the light emitting elements LD in the image display direction (for example, third direction DR3) of the display device. For example, the first electrode EL1 may further include metals such as magnesium (Mg), aluminum (Al), platinum (Pt), palladium (Pd), nickel (Ni), neodymium (Nd), iridium (Ir), chromium (Cr), titanium (Ti), molybdenum (Mo), and an alloy thereof.

The bonding electrode CP may be disposed on the first electrode EL1, and is a portion bonded to the light emitting elements LD. The bonding electrode CP may be disposed between the first electrode EL1 and the light emitting element LD, and may be electrically connected to the first electrode EL1 and the light emitting element LD. The bonding electrode CP may contact or directly contact the first end EP1 of the light emitting element LD to electrically connect the first electrode EL1 and the first end EP1 of the light emitting element LD.

The bonding electrode CP may be used as a reflective member for guiding light emitted from the light emitting elements LD in the image display direction (for example, third direction DR3) of the display device. To this end, the bonding electrode CP may be made of an opaque conductive material having a reflectivity. The bonding electrode CP may include the same material or a similar material as the first electrode EL1, or may include one or more selected from materials, for example, as the constituent material of the first electrode EL1. For example, the bonding electrode CP may include a metal such as copper (Cu), gold (Au), tin (Sn), and an alloy thereof capable of bonding to the light emitting element LD.

The light emitting element LD may be disposed on the bonding electrode CP. The first end EP1 of the light emitting element LD may be disposed on the bonding electrode CP, and the first end EP1 of the light emitting element LD may be physically and/or electrically connected to the bonding electrode CP.

The first end EP1 of the light emitting element LD may be disposed toward the bonding electrode CP, and the second end EP2 of the light emitting element LD may be disposed toward the second electrode EL2.

The light emitting element LD may be disposed between the bonding electrode CP and the second electrode EL2 in the height h direction of the light emitting element LD. The light emitting element LD shown in FIG. 8 may correspond to the light emitting element LD of FIG. 6 and FIG. 7 described above. In FIG. 8, in order to briefly illustrate the light emitting element LD, it is illustrated that the diameter of the first end EP1 and the diameter of the second end EP2 are the same.

An insulating film surrounding the surface of the light emitting element LD except for the first end EP1 and the second end EP2 may be further disposed on the side surface of the light emitting element LD. Due to the insulating film, the light emitting element LD may be more stably fixed on the bonding electrode CP.

The protective layer PVX may be disposed on portions of the second via layer VIA2, the first electrode EL1, the bonding electrode CP, and the light emitting element LD. The protective layer PVX may be disposed to cover or overlap a portion of the upper surface of the second via layer VIA2 and to entirely cover or overlap the first electrode EL1 and the bonding electrode CP. The protective layer PVX may be disposed between the light emitting elements LD so that the second end EP2 of the light emitting element LD is exposed.

The protective layer PVX may include an inorganic insulating film including an inorganic material or an organic insulating film including an organic material. In an embodiment, the protective layer PVX may be utilized as a planarization layer for reducing a step due to components disposed thereunder in the display element layer DPL. To this end, the protective layer PVX may be formed of an organic insulating film including an organic material.

The second electrode EL2 may be disposed on the light emitting element LD, the protective layer PVX, and the second via layer VIA2. The second electrode EL2 may be disposed to cover or overlap the light emitting element LD, the protective layer PVX, and the second via layer VIA2. The second electrode EL2 may be disposed to cover or overlap a portion of the upper surface of the passivation layer PSV.

The second electrode EL2 may include a transparent conductive material having a reflectivity. For example, the second electrode EL2 may include a conductive oxide such as an indium tin oxide (ITO), an indium zinc oxide (IZO), a zinc oxide (ZnO), an indium gallium zinc oxide (IGZO), or an indium tin zinc oxide (ITZO), and a conductive polymer such as poly(3,4-ethylenedioxythiophene (PEDOT). However, the material of the second electrode EL2 is not limited by the above description.

The second electrode EL2 may cover or overlap a portion of the upper surface of the bridge electrode BRD exposed by the opening OP of the second via layer VIA2. A portion of the upper surface of the bridge electrode BRD exposed by the opening OP of the second via layer VIA2 and the second electrode EL2 may be physically and/or electrically connected. The second electrode EL2 may be physically and/or electrically connected to the second end EP2 of the light emitting element LD exposed by the protective layer PVX. Accordingly, the voltage of the second driving power source VSS (see FIG. 5) provided through the bridge electrode BRD may be transmitted to the second end EP2 of the light emitting element LD. Here, the second electrode EL2 may be a cathode.

The second electrode EL2 may be disposed so as to entirely cover or overlap the upper surface of the display element layer DPL. Accordingly, in case that an electrical short circuit occurs between the light emitting element LD and the second electrode EL2 (or between the light emitting element LD and the first electrode EL1), a dark spot defect in which the entire pixel PXL does not emit light may occur.

In case that a dark spot defect occurs in at least one light emitting element LD in one pixel PXL, the luminance of the pixel PXL may deteriorate as a whole, so the display device may repair the defective pixel through a process (for example, laser cutting process) of partially opening the second electrode EL2 overlapping the short-circuited light emitting element LD.

However, even in case that the repair process is performed, the luminance of the defective pixel may be lowered as a whole compared to that of a normal pixel. The display device according to an embodiment divides one pixel PXL into areas, and divides and positions the first electrode EL1 in respective areas, so that in case that a pixel defect occurs, the remaining areas except for the defective area may be normally driven. Accordingly, it is possible to minimize a defective range in one pixel area and compensate for luminance.

Hereinafter, a display device according to an embodiment will be described with reference to FIG. 9 to FIG. 12.

FIG. 9 to FIG. 12 illustrate schematic top plan views of a display device according to an embodiment.

Referring to FIG. 9 to FIG. 12, the first electrode EL1, the second electrode EL2, and the light emitting element LD that form the display element layer DPL of the display device according to an embodiment are shown. Here, the first electrode EL1 may be an anode, and the second electrode EL2 may be a cathode.

One pixel PXL may include a light emitting area EMA and a non-light emitting area NEA. The light emitting area EMA is an area in which the light emitting elements LD are disposed, and the non-light emitting area NEA is an area surrounding the light emitting area EMA. The light emitting area EMA is an area from which light is emitted by the light emitting elements LD, and the non-light emitting area NEA is an area from which light is not emitted. Although not shown, a protective layer, a dam structure, a bank, and the like may be disposed in the non-light emitting area NEA.

The light emitting elements LD are disposed in the light emitting area EMA. The light emitting elements LD may be arranged or disposed within the light emitting area EMA in a number and position. For example, ten light emitting elements LD may be disposed in the light emitting area EMA (or pixel area) of one pixel PXL, and the ten light emitting elements LD may be arranged or disposed in a matrix format of 5 rows and 2 columns.

The first electrode EL1 may be disposed in the light emitting area EMA and the non-light emitting area NEA.

The first electrode EL1 overlaps at least one light emitting element LD. The first electrode EL1 may include area electrodes divided according to the number and position overlapping the light emitting element LD. A number of the area electrodes and a number of the pixel areas may be the same.

In an embodiment, one pixel PXL may include pixel areas, and the area electrodes forming the first electrode EL1 may be disposed to correspond to the pixel areas.

Figure 9:
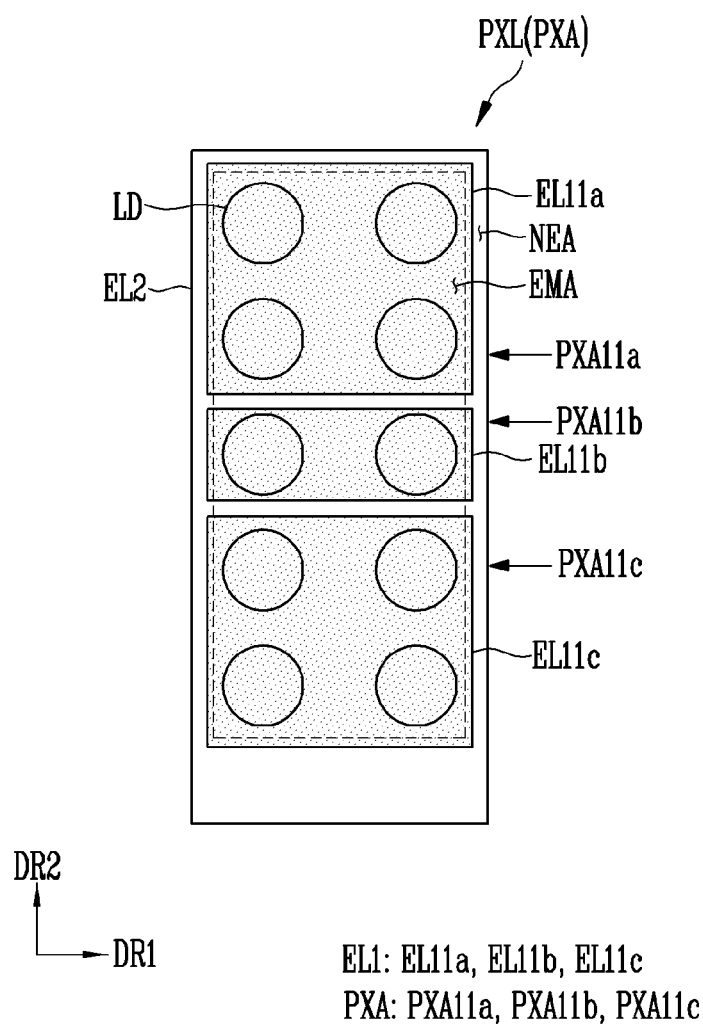
FIG. 9 to FIG. 12 illustrate schematic top plan views of a display device according to an embodiment.

For example, as shown in FIG. 9, one pixel PXL may include three pixel areas, and may include three area electrodes corresponding to the three pixel areas. The three area electrodes may form the first electrode EL1.

Figure 10:
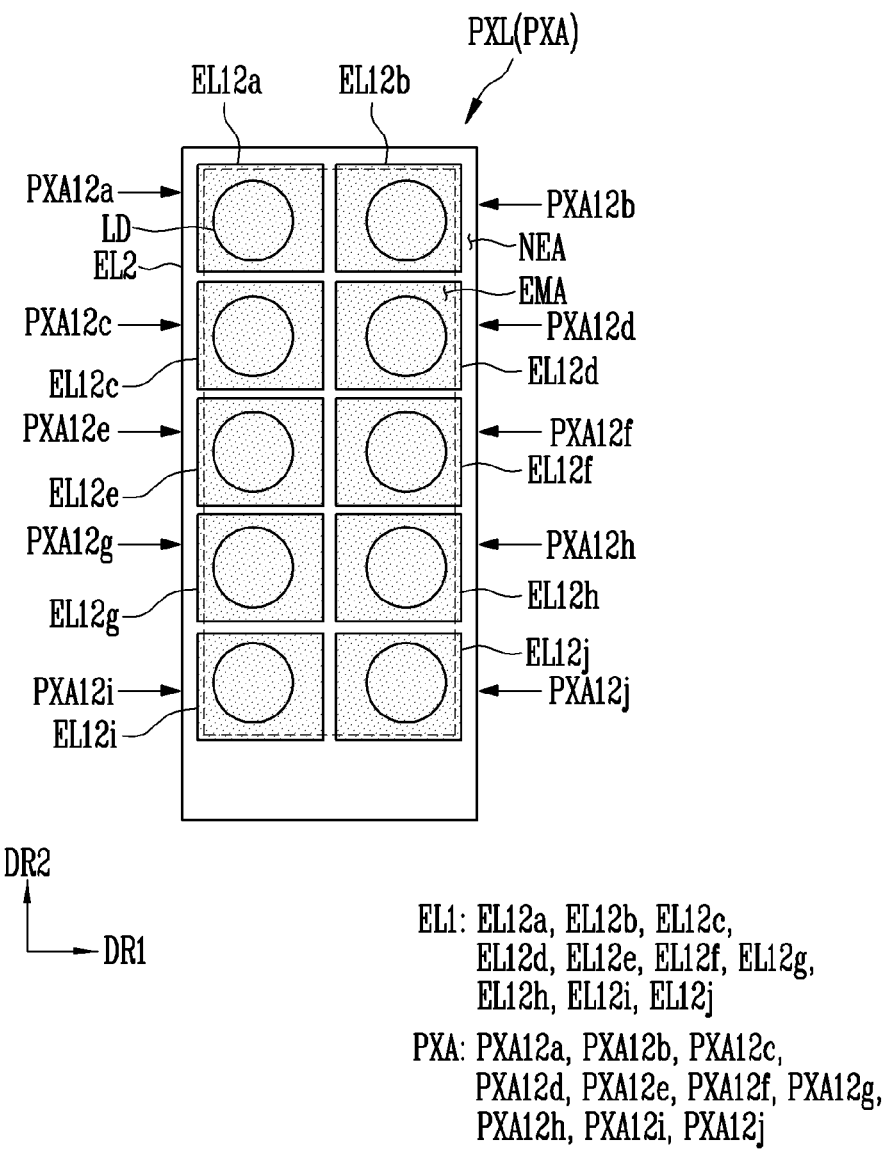

As shown in FIG. 10, one pixel PXL may include ten pixel areas, and may include ten area electrodes corresponding to the ten pixel areas. The ten area electrodes may form the first electrode EL1.

Figure 11:
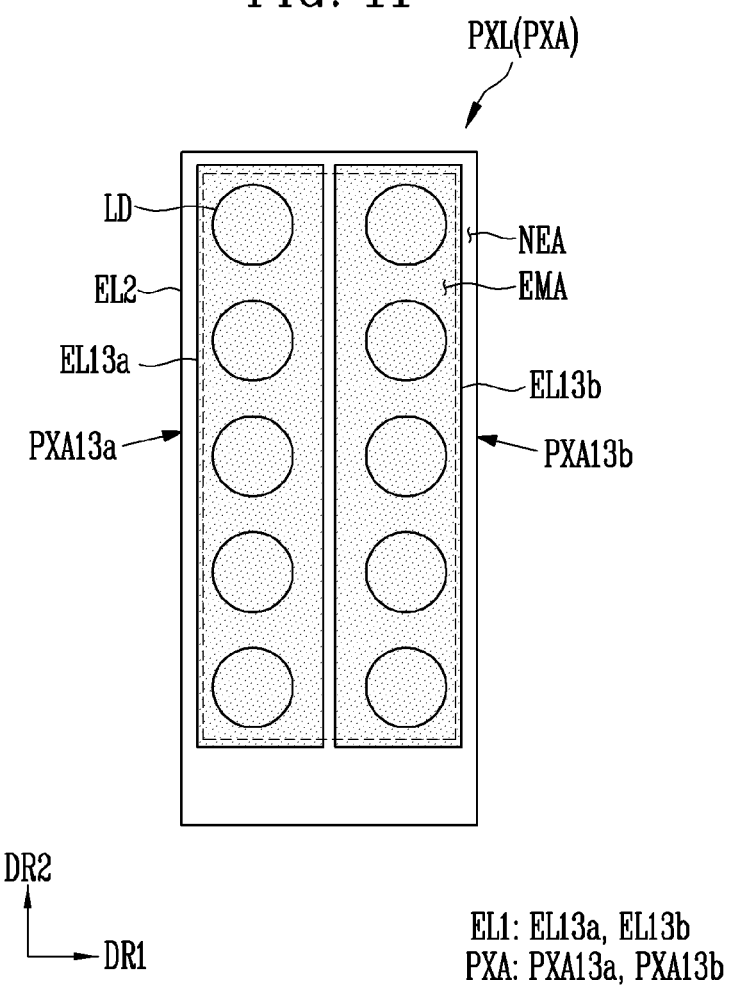
Figure 12:
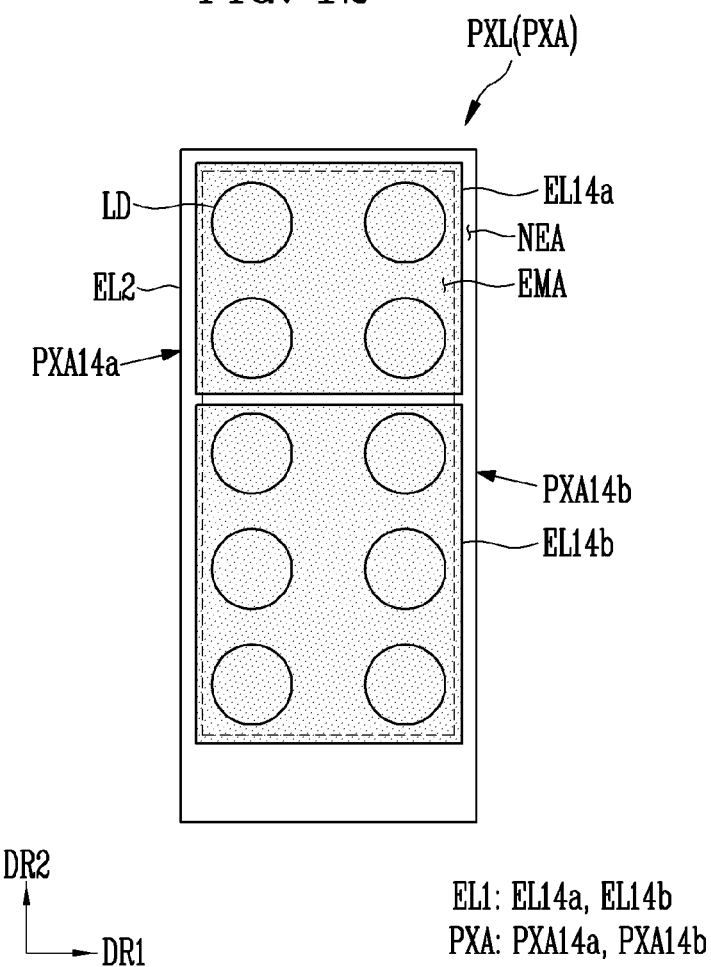

As shown in FIG. 11 and FIG. 12, one pixel PXL may include two pixel areas, and may include two area electrodes corresponding to the two pixel areas. The two area electrodes may form the first electrode ELL For example, as shown in FIG. 11, one pixel PXL may include two pixel areas vertically divided along a second direction DR2, and as shown in FIG. 12, one pixel PXL may include two pixel areas horizontally divided along a first direction DR1.

The second electrode EL2 overlaps the light emitting elements LD and the first electrode EL1, and covers or overlaps the light emitting elements LD and the first electrode EL1.

The second electrode EL2 may be entirely disposed in the pixel PXL throughout the light emitting area EMA and the non-light emitting area NEA.

Referring to FIG. 9, one pixel PXL (or, one pixel area PXA) may include a first pixel area PXA11a, a second pixel area PXA11b, and a third pixel area PXA11c.

The first pixel area PXA11a, the second pixel area PXA11b, and the third pixel area PXA11c are adjacent to each other along the second direction DR2 (or vertical direction). Each of the first pixel area PXA11a, the second pixel area PXA11b, and the third pixel area PXA11c may at least partially overlap each of the area electrodes of the first electrode EL1.

The first electrode EL1 may include a first area electrode EL11a, a second area electrode EL11b, and a third area electrode EL11c.

The first area electrode EL11a, the second area electrode EL11b, and the third area electrode EL11c are disposed to be spaced apart from each other along the second direction DR2.

The first area electrode EL11a may be disposed in the first pixel area PXA11a, the second area electrode EL11b may be disposed in the second pixel area PXA11b, and the third area electrode EL11c may be disposed in the third pixel area PXA11c.

Each of the first area electrode EL11a, the second area electrode EL11b, and the third area electrode EL11c may overlap at least one light emitting element LD. For example, the first area electrode EL11a overlaps four light emitting elements LD, the second area electrode EL11b overlaps two light emitting elements LD, and the third area electrode EL11c overlaps four light emitting elements LD. The disclosure is not limited thereto, and the number of the light emitting elements LD overlapping each of the area electrodes EL11a, EL11b, and EL11c may be variously changed.

The first area electrode EL11a, the second area electrode EL11b, and the third area electrode EL11c may have a same size or different sizes. For example, the first area electrode EL11a may have a same size as the third area electrode EL11c, and the second area electrode EL11b may have a smaller size than the first area electrode EL11a. The disclosure is not limited thereto, and the first area electrode EL11a, the second area electrode EL11b, and the third area electrode EL11c have various sizes that may overlap at least one light emitting element LD.

The first area electrode EL11a, the second area electrode EL11b, and the third area electrode EL11c may have a same shape or different shapes. For example, the first area electrode EL11a and the third area electrode EL11c may have a substantially rectangular shape, and the second area electrode EL11b may have a substantially square shape. The disclosure is not limited thereto, and the first area electrode EL11a, the second area electrode EL11b, and the third area electrode EL11c have various shapes that may overlap at least one light emitting element LD.

In case that a dark spot defect occurs in the light emitting element LD included in one of the first pixel area PXA11a, the second pixel area PXA11b, and the third pixel area PXA11c in one pixel PXL, the display device according to an embodiment may drive the light emitting elements LD in the remaining pixel areas except for the defective pixel area.

For example, in case that a dark spot defect occurs in one of the light emitting elements LD disposed in the first pixel area PXA11a, the light emitting elements LD disposed in the second pixel area PXA11b and the third pixel area PXA11c may be driven. Accordingly, it is possible to minimize the defective range in one pixel PXL.

The display device according to an embodiment may include the maximum number of the light emitting elements LD that may be included in one pixel PXL, and in case that a dark spot defect of a pixel occurs, the remaining light emitting elements LD may emit light to maintain luminance.

Referring to FIG. 10, one pixel PXL (or, one pixel area PXA) may include a first pixel area PXA12a, a second pixel area PXA12b, a third pixel area PXA12c, a fourth pixel area PXA12d, a fifth pixel area PXA12e, a sixth pixel area PXA12f, a seventh pixel area PXA12g, an eighth pixel area PXA12h, a ninth pixel area PXA12i, and a tenth pixel area PXA12j.

The first to tenth pixel area PXA12a, PXA12b, PXA12c, PXA12d, PXA12e, PXA12f, PXA12g, PXA12h, PXA12i, and PXA12j may be disposed in a matrix form.

The first pixel area PXA12a and the second pixel area PXA12b are adjacent to each other along the first direction DR1, and the first pixel area PXA12a is adjacent to the third pixel area PXA12c along the second direction DR2.

The third pixel area PXA12c and the fourth pixel area PXA12d are adjacent to each other along the first direction DR1, and the fourth pixel area PXA12d is adjacent to the second pixel area PXA12b along the second direction DR2.

The fifth pixel area PXA12e and the sixth pixel area PXA12f are adjacent to each other along the first direction DR1, the fifth pixel area PXA12e is adjacent to the third pixel area PXA12c along the second direction DR2, and the sixth pixel area PXA12f is adjacent to the fourth pixel area PXA12d along the second direction DR2.

The seventh pixel area PXA12g and the eighth pixel area PXA12h are adjacent to each other along first direction DR1, the seventh pixel area PXA12g is adjacent to the fifth pixel area PXA12e along the second direction DR2, and the eighth pixel area PXA12h is adjacent to the sixth pixel area PXA12f along the second direction DR2.

The ninth pixel area PXA12i and the tenth pixel area PXA12j are adjacent to each other along the first direction DR1, the ninth pixel area PXA12i is adjacent to the seventh pixel area PXA12g along the second direction DR2, and the tenth pixel area PXA12j is adjacent to the eighth pixel area PXA12h along the second direction DR2.

Each of the pixel areas PXA12a, PXA12b, PXA12c, PXA12d, PXA12e, PXA12f, PXA12g, PXA12h, PXA12i, and PXA12j may at least partially overlap each of the area electrodes of the first electrode EL1.

The first electrode EL1 may include a first area electrode EL12a, a second area electrode EL12b, a third area electrode EL12c, a fourth area electrode EL12d, a fifth area electrode EL12e, a sixth area electrode EL12f, a seventh area electrode EL12g, an eighth area electrode EL12h, a ninth area electrode EL12i, and a tenth area electrode EL12j.

The first to tenth area electrodes EL12a, EL12b, EL12c, EL12d, EL12e, EL12f, EL12g, EL12h, EL12i, and EL12j may be disposed in a matrix format.

The first area electrode EL12a and the second area electrode EL12b are disposed to be spaced apart from each other along the first direction DR1.

The third area electrode EL12c and the fourth area electrode EL12d are disposed to be spaced apart from each other along the first direction DR1, the third area electrode EL12c may be disposed to be spaced apart from the first area electrode EL12a along the second direction DR2, and the fourth area electrode EL12d may be disposed to be spaced apart from the second area electrode EL12b along the second direction DR2.

The fifth area electrode EL12e and the sixth area electrode EL12f are disposed to be spaced apart from each other along the first direction DR1, the fifth area electrode EL12e may be disposed to be spaced apart from the third area electrode EL12c along the second direction DR2, and the sixth area electrode EL12f may be disposed to be spaced apart from the fourth area electrode EL12d along the second direction DR2.

The seventh area electrode EL12g and the eighth area electrode EL12h are disposed to be spaced apart from each other along the first direction DR1, the seventh area electrode EL12g may be disposed to be spaced apart from the fifth area electrode EL12e along the second direction DR2, and the eighth area electrode EL12h may be disposed to be spaced apart from the sixth area electrode EL12f along the second direction DR2.

The ninth area electrode EL12i and the tenth area electrode EL12j are disposed to be spaced apart from each other along the first direction DR1, the ninth area electrode EL12i may be disposed to be spaced apart from the seventh area electrode EL12g along the second direction DR2, and the tenth area electrode EL12j may be disposed to be spaced apart from the eighth area electrode EL12h along the second direction DR2.

Each of the area electrodes EL12a, EL12b, EL12c, EL12d, EL12e, EL12f, EL12g, EL12h, EL12i, and EL12j may be disposed in each of the pixel areas PXA12a, PXA12b, PXA12c, PXA12d, PXA12e, PXA12f, PXA12g, PXA12h, PXA12i, and PXA12j.

Each of the area electrodes EL12a, EL12b, EL12c, EL12d, EL12e, EL12f, EL12g, EL12h, EL12i, and EL12j overlaps one light emitting element LD.

Respective area electrodes EL12a, EL12b, EL12c, EL12d, EL12e, EL12f, EL12g, EL12h, EL12i, and EL12j may have a same size or different sizes. For example, the first area electrode EL12a may have a same size as the second area electrode EL12b, and the first area electrode EL12a may have a different size from the third area electrode EL12c. The disclosure is not limited thereto, and each of the area electrodes EL12a, EL12b, EL12c, EL12d, EL12e, EL12f, EL12g, EL12h, EL12i, and EL12j may have various sizes that may overlap at least one light emitting element LD.

Respective area electrodes EL12a, EL12b, EL12c, EL12d, EL12e, EL12f, EL12g, EL12h, EL12i, and EL12j may have a same shape or different shapes. For example, all of the area electrodes EL12a, EL12b, EL12c, EL12d, EL12e, EL12f, EL12g, EL12h, EL12i, and EL12j may have a substantially square or rectangular shape. The disclosure is not limited thereto, and each of the area electrodes EL12a, EL12b, EL12c, EL12d, EL12e, EL12f, EL12g, EL12h, EL12i, and EL12j may have various shapes that may overlap at least one light emitting element LD.

In case that a dark spot defect occurs in the light emitting element LD included in one of the first to tenth pixel areas PXA12a, PXA12b, PXA12c, PXA12d, PXA12e, PXA12f, PXA12g, PXA12h, PXA12i, and PXA12j in one pixel PXL, the display device according to an embodiment may drive the light emitting elements LD in the remaining pixel areas except for the defective pixel area.

For example, in case that a dark spot defect occurs in one of the light emitting elements LD disposed in the first pixel area PXA12a, the light emitting elements LD disposed in the remaining pixel areas PXA12b, PXA12c, PXA12d, PXA12e, PXA12f, PXA12g, PXA12h, PXA12i, and PXA12j may be driven. Accordingly, it is possible to minimize the defective range in one pixel PXL.

The display device according to an embodiment may include the maximum number of the light emitting elements LD that may be included in one pixel PXL, and in case that a dark spot defect of a pixel occurs, the remaining light emitting elements LD may emit light to maintain luminance.

Referring to FIG. 11, one pixel PXL (or, one pixel area PXA) may include a first pixel area PXA13a and a second pixel area PXA13b.

The first pixel area PXA13a and the second pixel area PXA13b are adjacent to each other along the first direction DR1 (or horizontal direction). Each of the first pixel area PXA13a and the second pixel area PXA13b may overlap at least partially each of the area electrodes of the first electrode EL1.

The first electrode EL1 may include a first area electrode EL13a and a second area electrode EL13b.

The first area electrode EL13a and the second area electrode EL13b are disposed to be spaced apart from each other along the first direction DR1.

The first area electrode EL13a may be disposed in the first pixel area PXA13a, and the second area electrode EL13b may be disposed in the second pixel area PXA13b.

Each of the first area electrode EL13a and the second area electrode EL13b may overlap at least one light emitting element LD. The number of light emitting elements LD overlapping the first area electrode EL13a may be the same as the number of light emitting elements LD overlapping the second area electrode EL13b. For example, the first area electrode EL13a and the second area electrode EL13b overlap five light emitting elements LD, respectively. The disclosure is not limited thereto, and the number of the light emitting elements LD overlapping the first area electrode EL13a and the second area electrode EL13b may be variously changed.

The first area electrode EL13a and the second area electrode EL13b may have a same size or different sizes. For example, the first area electrode EL13a and the second area electrode EL13b may have a same size. The disclosure is not limited thereto, and the first area electrode EL13a and the second area electrode EL13b may have various sizes that may overlap at least one light emitting element LD.

The first area electrode EL13a and the second area electrode EL13b may have a same shape or different shapes. For example, the first area electrode EL13a and the second area electrode EL13b may have a substantially rectangular shape. The disclosure is not limited thereto, and the first area electrode EL13a and the second area electrode EL13b may have various shapes that may overlap at least one light emitting element LD.

In case that a dark spot defect occurs in the light emitting element LD included in one of the first pixel area PXA13a and the second pixel area PXA13b in one pixel PXL, the display device according to an embodiment may drive the light emitting elements LD in the remaining pixel areas except for the defective pixel area.

For example, in case that a dark spot defect occurs in one of the light emitting elements LD disposed in the first pixel area PXA13a, the light emitting elements LD disposed in the second pixel area PXA13b may be driven. Accordingly, it is possible to minimize the defective range in one pixel PXL.

The display device according to an embodiment may include the maximum number of the light emitting elements LD that may be included in one pixel PXL, and in case that a dark spot defect of a pixel occurs, the remaining light emitting elements LD may emit light to maintain luminance.

Referring to FIG. 12, one pixel PXL (or, one pixel area PXA) may include a first pixel area PXA14a and a second pixel area PXA14b.

The first pixel area PXA14a and the second pixel area PXA14b are adjacent to each other along the second direction DR2. Each of the first pixel area PXA14a and the second pixel area PXA14b may overlap at least partially each of the area electrodes of the first electrode EL1.

The first electrode EL1 may include a first area electrode EL14a and a second area electrode EL14b.

The first area electrode EL14a and the second area electrode EL14b are disposed to be spaced apart from each other along the second direction DR2.

The first area electrode EL14a may be disposed in the first pixel area PXA14a, and the second area electrode EL14b may be disposed in the second pixel area PXA14b.

Each of the first area electrode EL14a and the second area electrode EL14b may overlap at least one light emitting element LD. The number of light emitting elements LD overlapping the first area electrode EL14a may be different from the number of light emitting elements LD overlapping the second area electrode EL14b. For example, the first area electrode EL14a overlaps four light emitting elements LD, and the second area electrode EL14b overlaps six light emitting elements LD. The disclosure is not limited thereto, and the number of the light emitting elements LD overlapping the first area electrode EL14a and the second area electrode EL14b may be variously changed.

The first area electrode EL14a and the second area electrode EL14b may have a same size or different sizes. For example, the first area electrode EL14a and the second area electrode EL14b may have different sizes. The disclosure is not limited thereto, and the first area electrode EL14a and the second area electrode EL14b may have various sizes that may overlap at least one light emitting element LD.

The first area electrode EL14a and the second area electrode EL14b may have a same shape or different shapes. For example, the first area electrode EL14a may have a substantially square shape, and the second area electrode EL14b may have a substantially rectangular shape. The disclosure is not limited thereto, and the first area electrode EL14a and the second area electrode EL14b may have various shapes that may overlap at least one light emitting element LD.

In case that a dark spot defect occurs in the light emitting element LD included in one of the first pixel area PXA14a and the second pixel area PXA14b in one pixel PXL, the display device according to an embodiment may drive the light emitting elements LD in the remaining pixel areas except for the defective pixel area.

For example, in case that a dark spot defect occurs in one of the light emitting elements LD disposed in the first pixel area PXA14a, the light emitting elements LD disposed in the second pixel area PXA14b may be driven. Accordingly, it is possible to minimize the defective range in one pixel PXL.

The display device according to an embodiment may include the maximum number of the light emitting elements LD that may be included in one pixel PXL, and in case that a dark spot defect of a pixel occurs, the remaining light emitting elements LD may emit light to maintain luminance.

Hereinafter, a case in which a dark spot defect of a pixel occurs in the display device according to an embodiment will be described with reference to FIG. 13.

Figure 13:
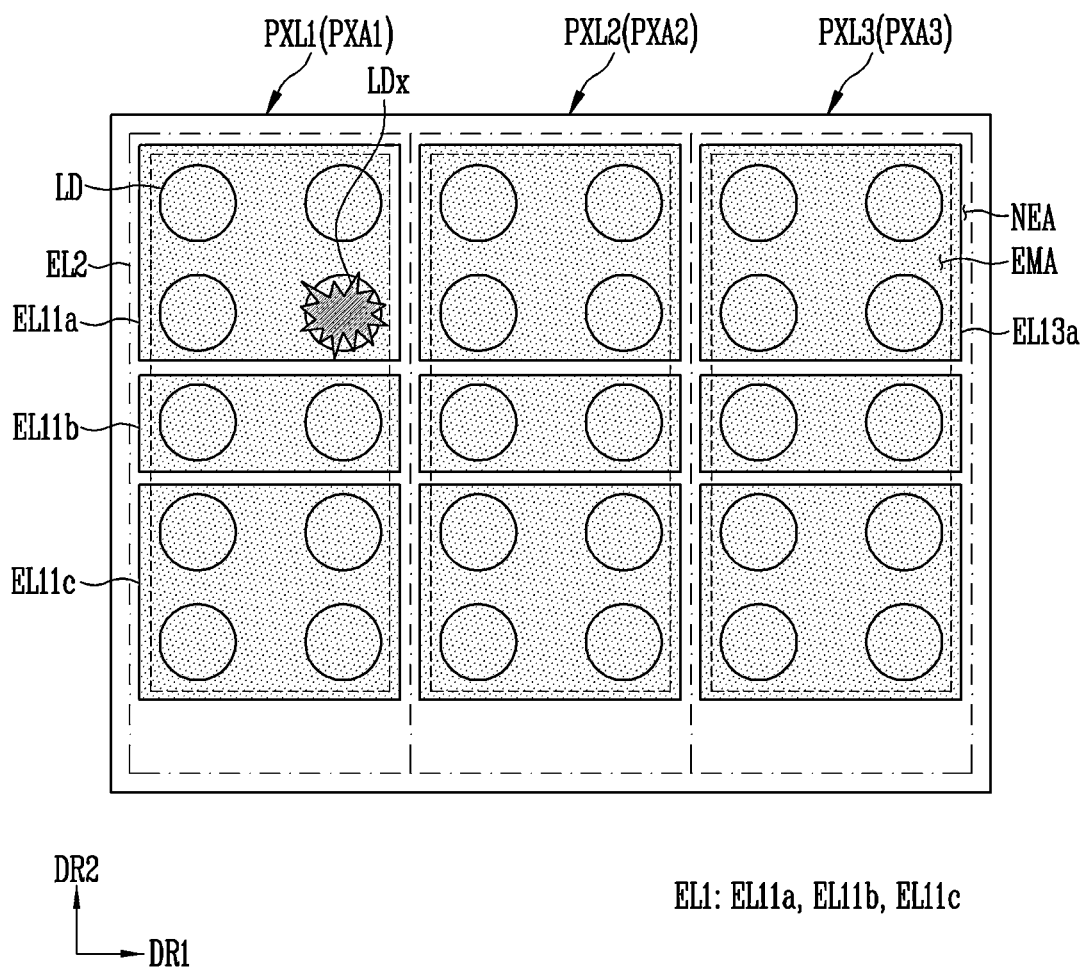
FIG. 13 illustrates a pixel defect in a display device according to an embodiment.

FIG. 13 illustrates a pixel defect in a display device according to an embodiment.

Referring to FIG. 13, the pixel PXL described in FIG. 9 is illustrated as a first pixel PXL1, a second pixel PXL2, and a third pixel PXL3. The first pixel PXL1, the second pixel PXL2, and the third pixel PXL3 are disposed to be adjacent to each other along the first direction DR1. The first pixel PXL1, the second pixel PXL2, and the third pixel PXL3, may respectively correspond to a first pixel area (PXA1), a second pixel area (PXA2), and a third pixel area (PXA3), but the disclosure is not limited thereto.

For example, in case that a dark spot defect occurs in an x-th light emitting element LDx of the first pixel PXL1, the first area electrode EL11a overlapping the x-th light emitting element LDx may not be normally driven. On the other hand, the second area electrode EL11b and the third area electrode EL13a spaced apart from the first area electrode EL11a may be normally driven. Accordingly, the display device according to an embodiment may drive the light emitting elements LD disposed in the remaining pixel areas except for the defective area. It is possible to minimize the defective range in one pixel PXL.

Since the light emitting elements LD disposed in the remaining pixel areas except for the defective area may be driven, the luminance of the display device may be maintained.

Hereinafter, a display device according to an embodiment will be described with reference to FIG. 14 to FIG. 17.

FIG. 14 to FIG. 17 illustrate schematic top plan views of a display device according to an embodiment. FIG. 14 to FIG. 17 have a difference in the number of light emitting elements LD compared with FIG. 9 to FIG. 12 described above. Therefore, hereinafter, descriptions overlapping those described in FIG. 9 to FIG. 12 will be omitted.

Referring to FIG. 14 to FIG. 17, one pixel PXL may include light emitting elements LD.

For example, one pixel PXL may include five light emitting elements LD. The five light emitting elements LD may be spaced apart from each other to be disposed in a zigzag pattern along the second direction DR2.

Figure 14:
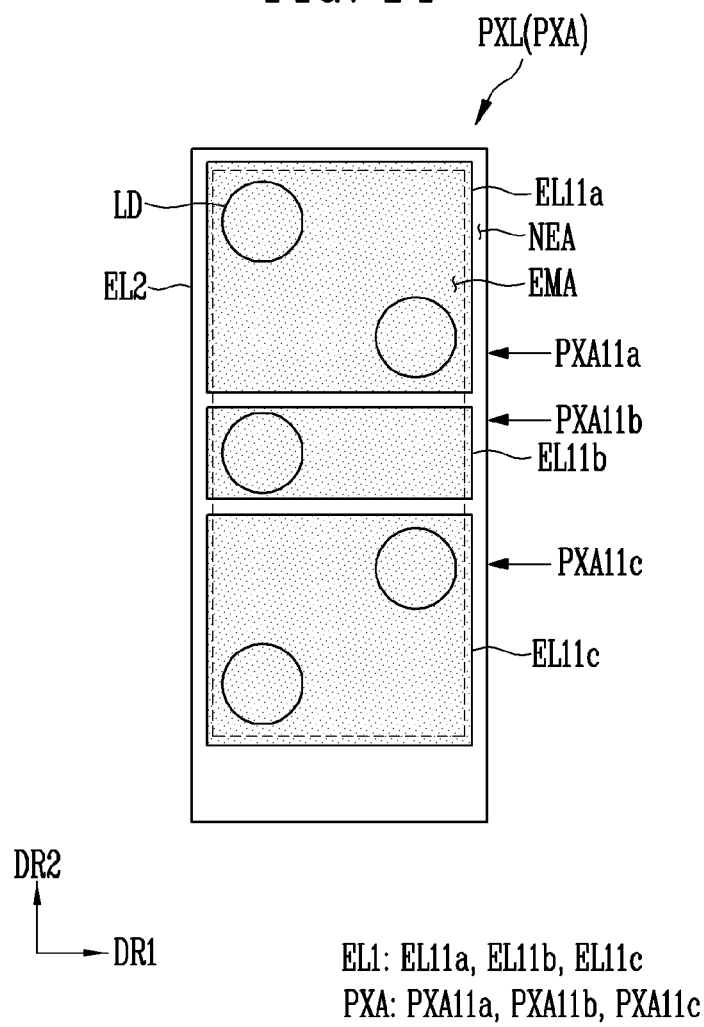
FIG. 14 to FIG. 17 illustrate schematic top plan views of a display device according to an embodiment.

Referring to FIG. 14, two light emitting elements LD may be disposed in the first pixel area PXA11a, one light emitting element LD may be disposed in the second pixel area PXA11b, and two light emitting elements LD may be disposed in the third pixel area PXA11c.

The first area electrode EL11a may overlap two light emitting elements LD. The two light emitting elements LD may be disposed to be spaced apart from each other in a first diagonal direction.

The second area electrode EL11b may overlap one light emitting element LD. One light emitting element LD may be disposed to be spaced apart from one light emitting device LD disposed at a lower end portion along the second direction DR2 among two light emitting elements LD of the first area electrode EL11a in a second diagonal direction.

The third area electrode EL11c may overlap two light emitting elements LD. The two light emitting elements LD may be disposed to be spaced apart from each other in the first diagonal direction.

Accordingly, in case that a dark spot defect occurs in the light emitting element LD included in one of the first pixel area PXA11a, the second pixel area PXA11b, and the third pixel area PXA11c in one pixel PXL, the display device according to an embodiment may drive the light emitting elements LD in the remaining pixel areas except for the defective pixel area. It is possible to minimize the defective range in one pixel PXL.

Figure 15:
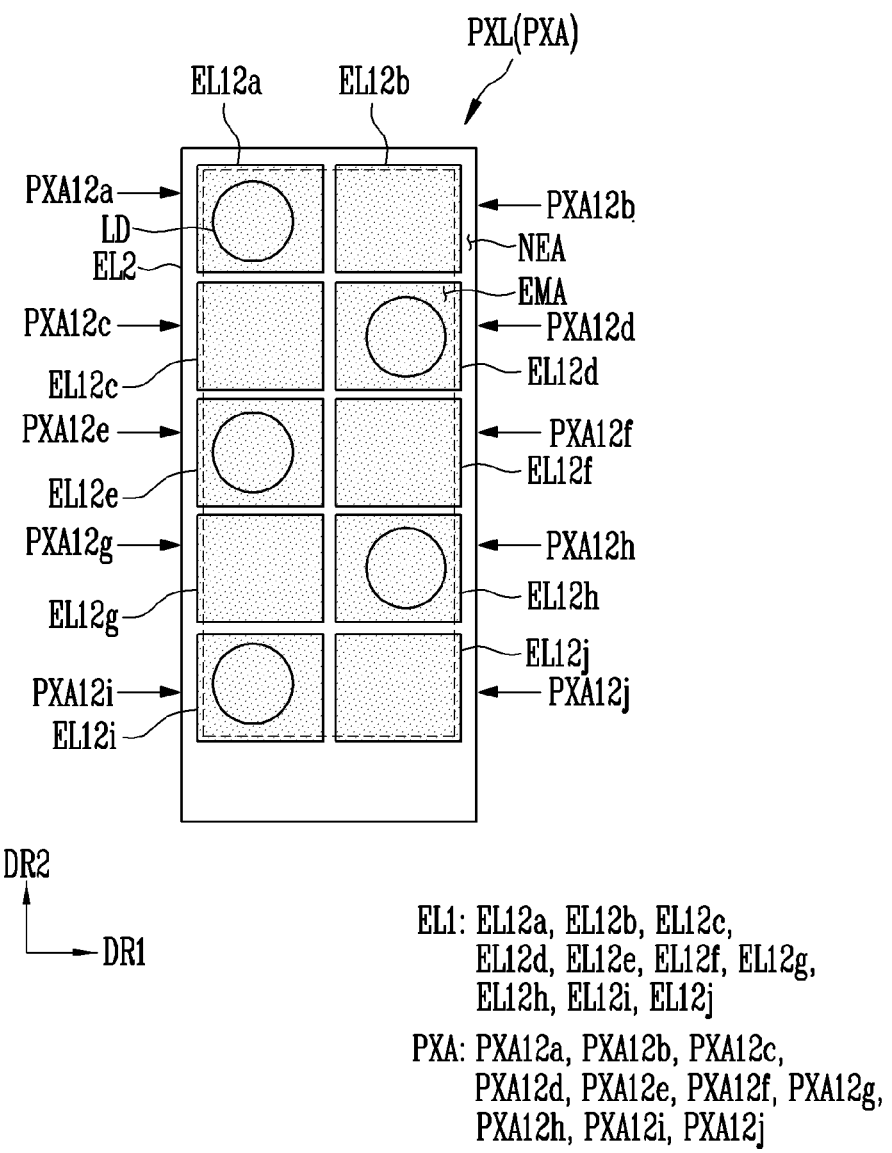

Referring to FIG. 15, one light emitting element LD may be disposed in each of the first pixel area PXA12a, the fourth pixel area PXA12d, the fifth pixel area PXA12e, the eighth pixel area PXA12h, and the ninth pixel area PXA12i.

Each of the first area electrode EL12a, the fourth area electrode EL12d, the fifth area electrode EL12e, the eighth area electrode EL12h, and the ninth area electrode EL12i may overlap one light emitting element LD.

Accordingly, in case that a dark spot defect occurs in the light emitting element LD included in one of the first, fourth, fifth, eighth, and ninth pixel areas PXA12a, PXA12d, PXA12e, PXA12h, and PXA12i in one pixel PXL, the display device according to an embodiment may drive the light emitting elements LD in the remaining pixel areas except for the defective pixel area. Accordingly, it is possible to minimize the defective range in one pixel PXL.

Figure 16:
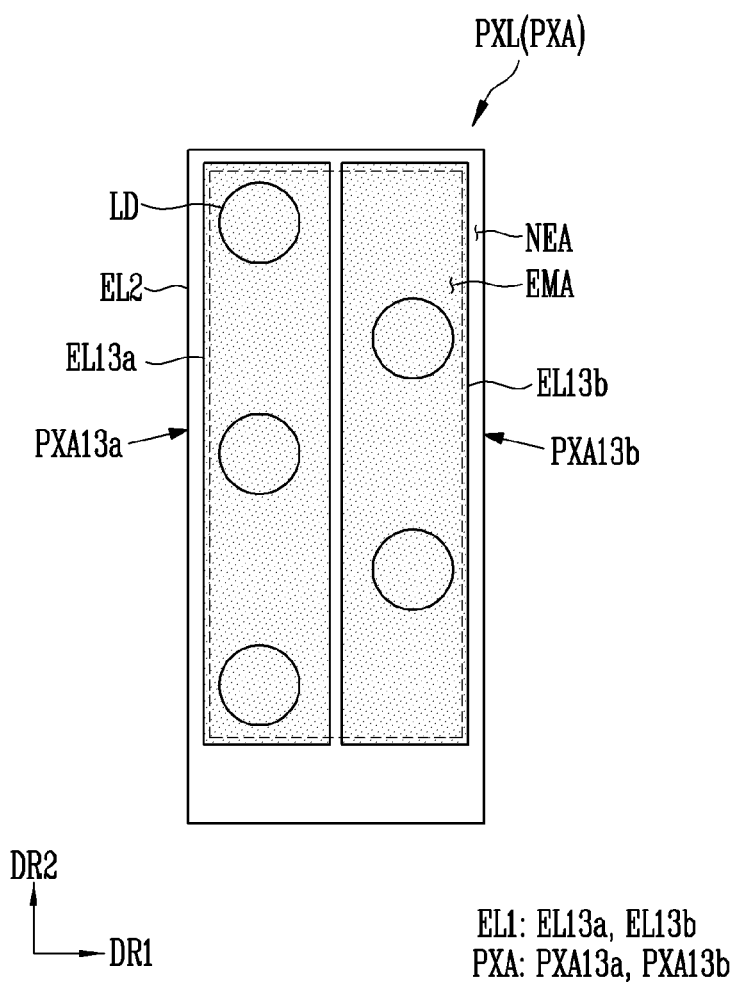

Referring to FIG. 16, three light emitting elements LD may be disposed in the first pixel area PXA13a, and two light emitting elements LD may be disposed in the second pixel area PXA13b.

The first area electrode EL13a may overlap three light emitting elements LD, and the second area electrode EL13b may overlap two light emitting elements LD.

In case that a dark spot defect occurs in the light emitting element LD included in one of the first pixel area PXA13a and the second pixel area PXA13b in one pixel PXL, the display device according to an embodiment may drive the light emitting elements LD in the remaining pixel areas except for the defective pixel area. Accordingly, it is possible to minimize the defective range in one pixel PXL.

Figure 17:
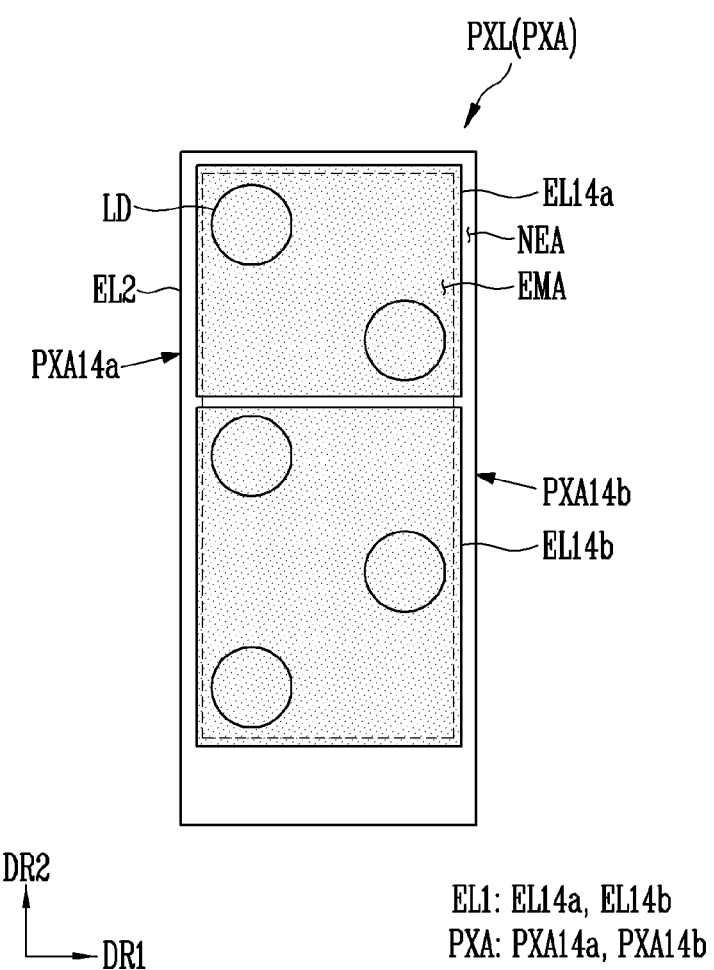

Referring to FIG. 17, two light emitting elements LD may be disposed in the first pixel area PXA14a, and three light emitting elements LD may be disposed in the second pixel area PXA14b.

The first area electrode EL14a may overlap two light emitting elements LD, and the second area electrode EL14b may overlap three light emitting elements LD.

In case that a dark spot defect occurs in the light emitting element LD included in one of the first pixel area PXA14a and the second pixel area PXA14b in one pixel PXL, the display device according to an embodiment may drive the light emitting elements LD in the remaining pixel areas except for the defective pixel area. Accordingly, it is possible to minimize the defective range in one pixel PXL.

Hereinafter, various embodiments to which the display device according to an embodiment may be applied will be described with reference to FIG. 18 to FIG. 21.

Figure 18:
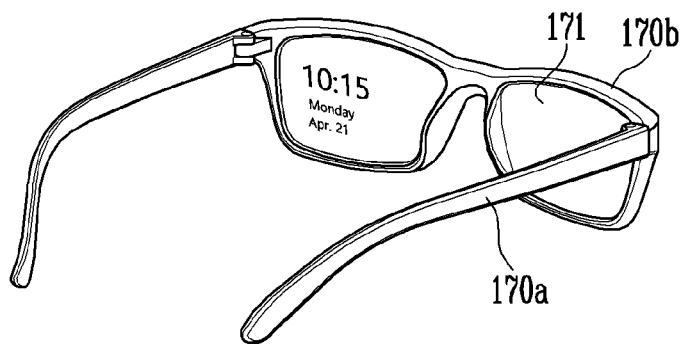
FIG. 18 is a drawing in which a display device according to an embodiment is applied to a smart glass.
Figure 19:
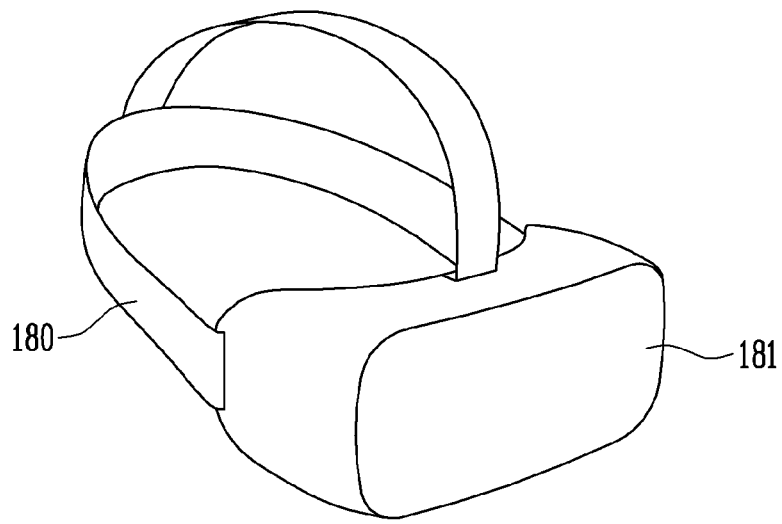
FIG. 19 is a drawing in which a display device according to an embodiment is applied to a head mounted display.
Figure 20:
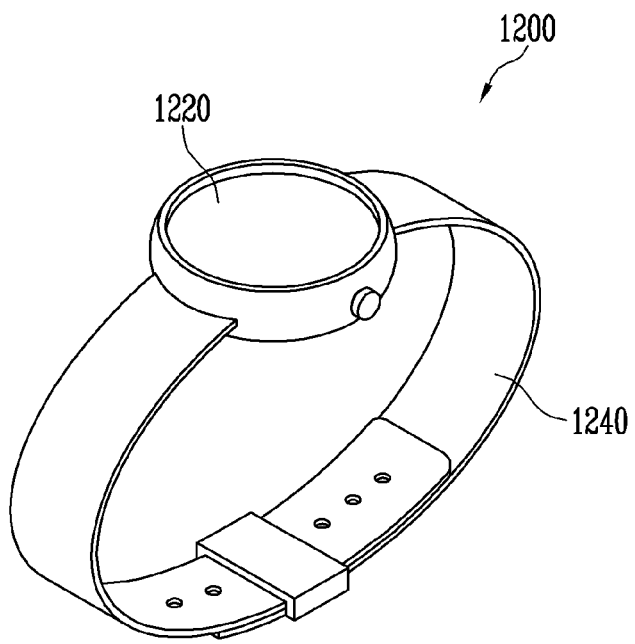
FIG. 20 is a drawing in which a display device according to an embodiment is applied to a smart watch.
Figure 21:
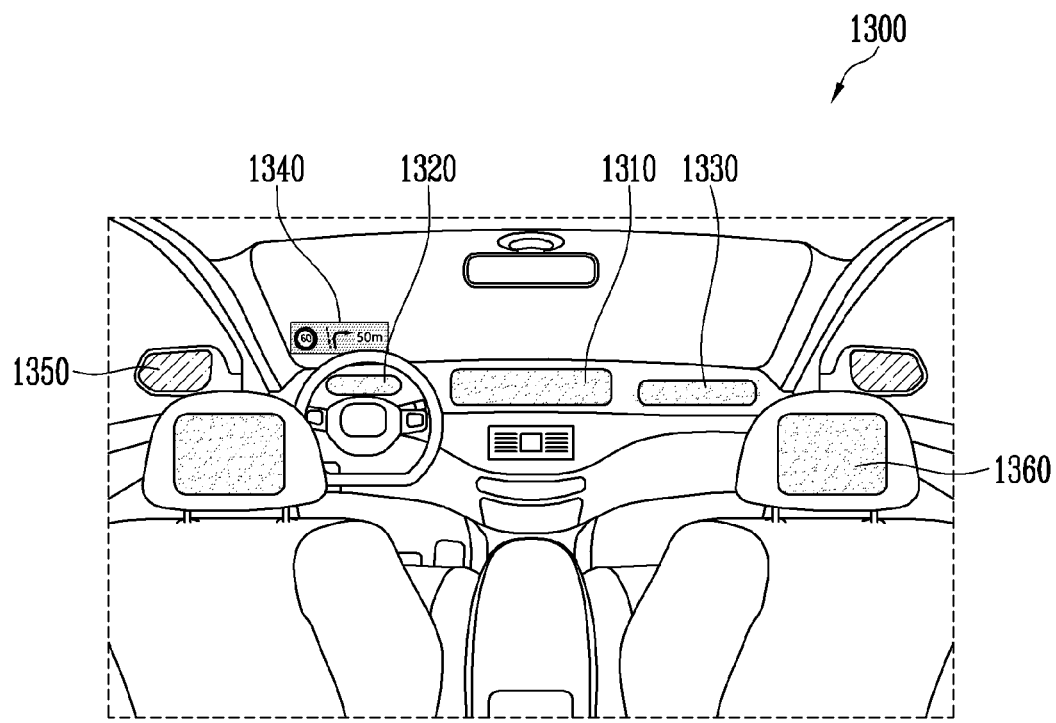
FIG. 21 is a drawing in which a display device according to an embodiment is applied to an automotive display.

FIG. 18 is a drawing in which a display device according to an embodiment is applied to a smart glass, FIG. 19 is a drawing in which a display device according to an embodiment is applied to a head mounted display, FIG. 20 is a drawing in which a display device according to an embodiment is applied to a smart watch, and FIG. 21 is a drawing in which a display device according to an embodiment is applied to an automotive display.

Referring to FIG. 18, the display device according to an embodiment may be applied to a smart glass including a frame 170 and a lens part 171. The smart glass is a wearable electronic device that may be worn on a user's face, and may have a structure in which a portion of the frame 170 is folded or unfolded. For example, the smart glass may be a wearable device for augmented reality (AR).

The frame 170 may include a housing 170b supporting the lens part 171 and a leg part 170a for a user to wear. The leg part 170a may be connected to or coupled to the housing 170b by a hinge to be folded or unfolded.

A battery, a touch pad, a microphone, and a camera may be embedded in the frame 170. A projector that outputs light and a processor that controls an optical signal and the like may be embedded in the frame 170.

The lens part 171 may be an optical member that transmits light or reflects light. The lens part 171 may include glass, a transparent synthetic resin, or the like within the spirit and the scope of the disclosure.

The lens part 171 may reflect an image by an optical signal transmitted from the projector of the frame 170 by a rear surface (for example, a surface of a direction directed to the user's eyes) of the lens part 171, so that it is possible to allow the user's eyes to recognize it. For example, the user may recognize information such as time and date displayed on the lens part 171 as shown in the drawing. The lens part 171 is a kind of display device, and the display device according to the above-described embodiment may be applied to the lens part 171.

Referring to FIG. 19, the display device according to an embodiment may be applied to a head mounted display (HMD) including a head mounting band 180 and a display receiving case 181. The head mounted display is a wearable electronic device that may be worn on the user's head.

The head mounting band 180 is connected to the display receiving case 181 to fix the display receiving case 181. In the drawing, the head mounting band 180 has been shown to surround an upper side of the user's head and both sides thereof, but the disclosure is not limited thereto. The head mounting band 180 is for fixing the head mounted display to the user's head, and may be formed in a form of a spectacle frame or a helmet.

The display receiving case 181 accommodates the display device, and may include at least one lens. The at least one lens is a part that provides an image to the user. For example, the display device according to an embodiment may be applied to a left eye lens and a right eye lens implemented in the display receiving case 181.

Referring to FIG. 20, the display device according to an embodiment may be applied to a smart watch 1200 including a display part 1220 and a strap part 1240.

The smart watch 1200 is a wearable electronic device, and may have a structure in which the strap part 1240 is mounted on a user's wrist. Here, the display device according to an embodiment is applied to the display part 1220, so that image data including time information may be provided to the user.

Referring to FIG. 21, the display device according to an embodiment may be applied to an automotive display 1300. Here, the automotive display 1300 may refer to an electronic device that is provided inside and outside a vehicle to provide image data.

For example, the display device may be applied to at least one of an infotainment panel 1310, a cluster 1320, a co-driver display 1330, a head-up display 1340, a side mirror display 1350, and a rear-seat display 1360, which are provided in the vehicle.

Hereinafter, a circuit diagram of one pixel included in an embodiment will be described with reference to FIG. 22.

Figure 22:
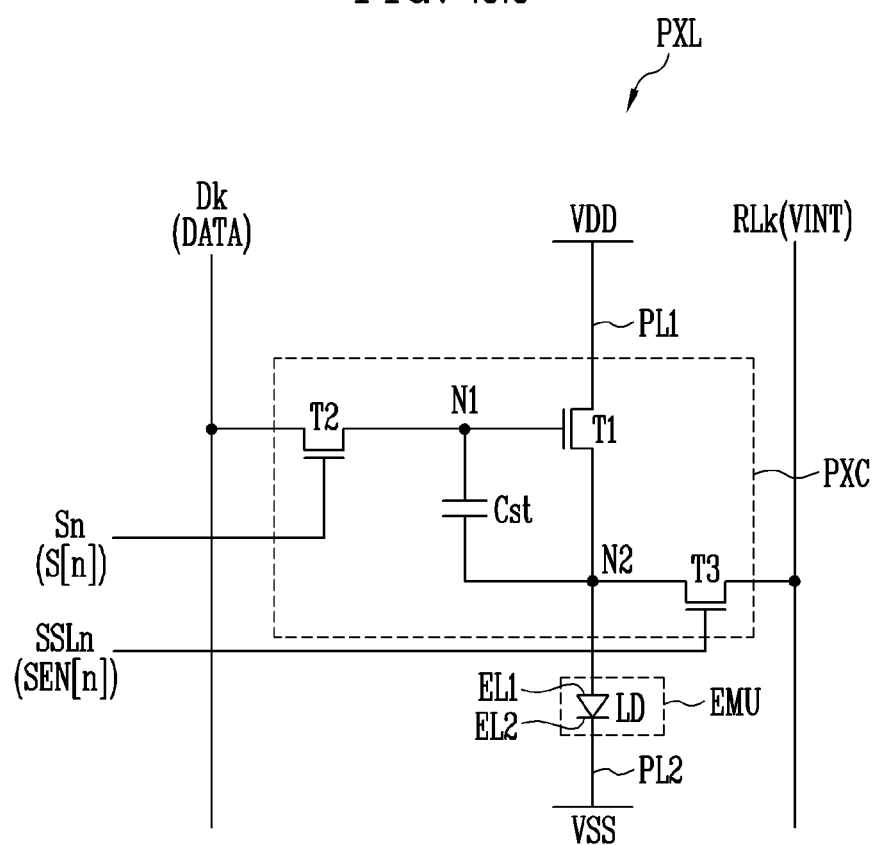
FIG. 22 illustrates a schematic diagram of an equivalent circuit of an electrical connection relationship of one pixel included in a display device according to an embodiment.

FIG. 22 illustrates schematic diagram of an equivalent circuit of an electrical connection relationship of one pixel included in a display device according to an embodiment. One pixel shown in FIG. 22 has a configuration similar to that of FIG. 5, so descriptions overlapping those of FIG. 5 will be omitted below.

Referring to FIG. 22, one pixel PXL may include at least one light emitting unit EMU that generates luminance light corresponding to a data signal. One pixel PXL may further selectively include the pixel circuit PXC for driving the light emitting unit EMU.

The pixel circuit PXC is connected to a scan line Sn and a data line Dk of one pixel PXL. For example, in case that the pixel PXL may be disposed in an n-th (n is a natural number) row and a k-th (k is a natural number) column of the display area DA (see FIG. 3), the pixel circuit PXC of the pixel PXL may be connected to an n-th scan line Sn and a k-th data line Dk of the display area DA.

The pixel circuit PXC may include a first transistor T1, a second transistor T2, a third transistor T3, and a storage capacitor Cst.

A first terminal (or first electrode) of the first transistor T1 (or driving transistor) is connected to the first driving power source VDD, and a second terminal (or second electrode) thereof is electrically connected to the first electrode EL1 (or second node N2) of the light emitting unit EMU. A gate electrode of the first transistor T1 is connected to a first node N1. Accordingly, the first transistor T1 may control an amount of driving current supplied to the light emitting element LD in response to a voltage of the first node N1.

A first terminal (or first electrode) of the second transistor T2 (or switching transistor) is connected to a k-th data line Dk, and a second terminal (or second electrode) thereof is connected to the first node N1. A gate electrode of the second transistor T2 is connected to the scan line Sn. The second transistor T2 is turned on in case that a scan signal S[n] of a turn-on voltage is supplied from the scan line Sn, and electrically connects the data line Dk and the first node N1. In case that a data voltage (DATA) of one frame is supplied to the k-th data line Dk, the data voltage (DATA) is transmitted to the first node N1. The data voltage (DATA) transmitted to the first node N1 is charged in the storage capacitor Cst.

A first terminal (or first electrode) of the third transistor T3 (or sensing transistor) may be connected to a k-th sensing line RLk, and a second terminal (or second electrode) may be connected to the second node N2 (or second terminal of first transistor T1). A gate electrode of the third transistor T3 may be connected to an n-th sensing control line SSLn. The third transistor T3 is turned on in case that a sensing control signal SEN[n] (for example, high level voltage) is supplied to the n-th sensing control line SSLn, and may electrically connect the k-th sensing line RLk and the second node N2. Accordingly, an initialization voltage VINT may be provided to the second node N2 for a time.

One electrode of the storage capacitor Cst is connected to the first node N1, and the other electrode thereof is connected to the second node N2 (or the first terminal of the first transistor T1). The storage capacitor Cst may be charged with a voltage corresponding to a voltage difference between the data voltage DATA supplied to the first node N1 and the voltage of the second node N2, and may maintain the charged voltage until the data voltage DATA of a next frame is supplied.

FIG. 22 illustrates an embodiment in which both the first transistor T1 and the second transistor T2 are N-type transistors, but the disclosure is not limited thereto. In an embodiment, at least one of the first transistor T1 and the second transistor T2 may be changed to a P-type transistor.

Hereinafter, a pixel according to an embodiment will be described with reference to FIG. 23.

Figure 23:
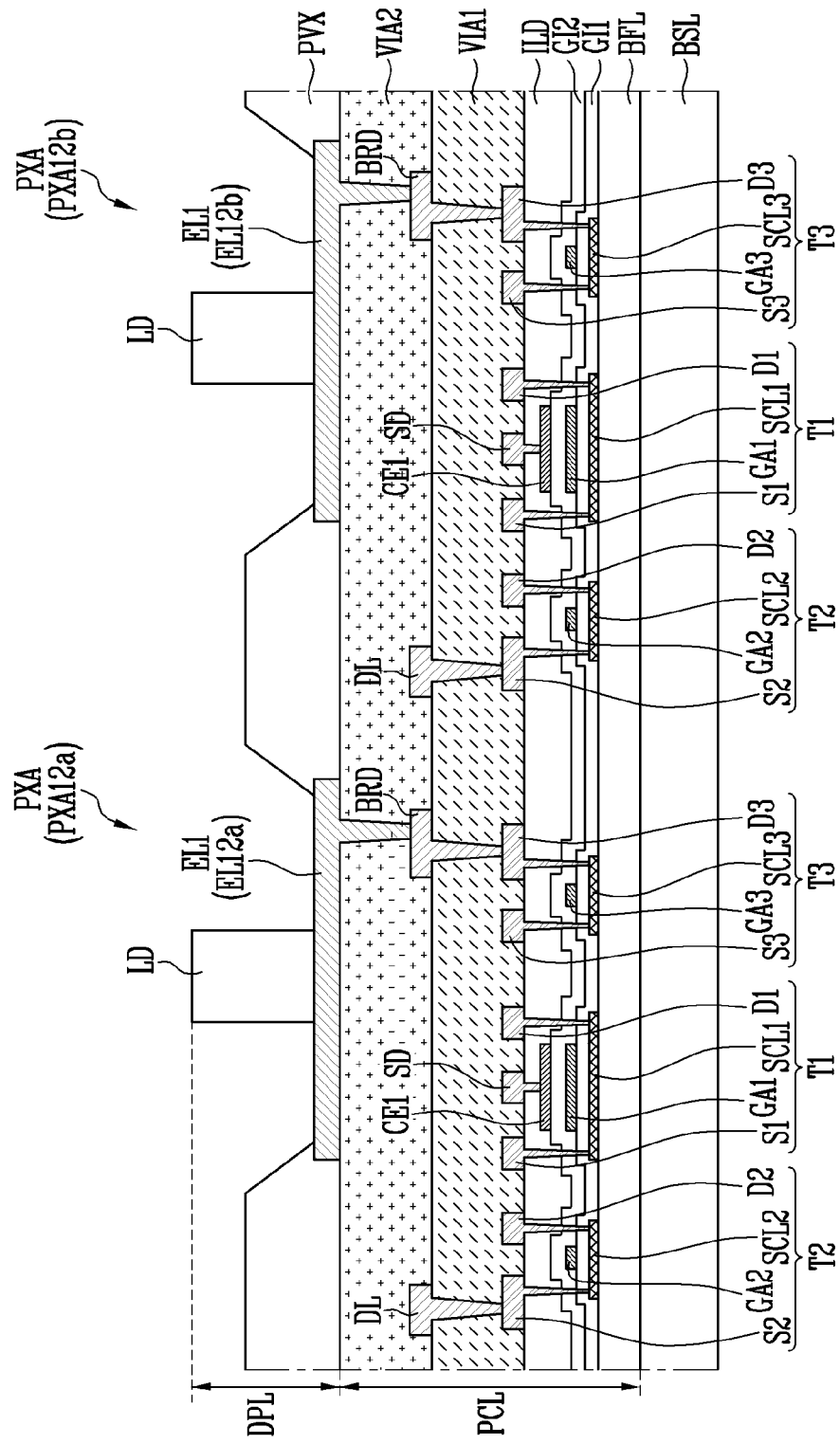
FIG. 23 illustrates a schematic cross-sectional view of the pixel shown in FIG. 22.

FIG. 23 illustrates a schematic cross-sectional view of the pixel shown in FIG. 22. Since the cross-sectional view shown in FIG. 23 is similar to that shown in FIG. 8 described above, descriptions overlapping those of FIG. 8 will be omitted below.

Referring to FIG. 23, each pixel area PXA included in the display device according to an embodiment may include the base layer BSL, the pixel circuit layer PCL, and the display element layer DPL. Here, each pixel area PXA may correspond to the first pixel area PXA12a and the second pixel area PXA12b described with reference to FIG. 10.

The pixel circuit layer PCL may include at least one transistor and wires connected to the at least one transistor. The pixel circuit layer PCL may include a buffer layer BFL, a first gate insulating layer GI1, a second gate insulating layer GI2, an interlayer insulating layer ILD, a first via layer VIA1, and a second via layer VIA2 that may be sequentially stacked each other on one surface or a surface of the base layer BSL.

The first transistor T1 may include a first semiconductor pattern SCL1, a driving gate electrode GA1, a first source electrode S1, and a first drain electrode D1. Here, the first source electrode S1 may have a same configuration as the first terminal of the first transistor T1 described with reference to FIG. 22, and the first drain electrode D1 may have a same configuration as the second terminal of the first transistor T1 described with reference to FIG. 22.

The second transistor T2 may include a second semiconductor pattern SCL2, a switching gate electrode GA2, a second source electrode S2, and a second drain electrode D2. Here, the second source electrode S2 may have a same configuration as the first terminal of the second transistor T2 described with reference to FIG. 22, and the second drain electrode D2 may have a same configuration as the second terminal of the second transistor T2 described with reference to FIG. 22.

The third transistor T3 may include a third semiconductor pattern SCL3, a sensing gate electrode GA3, a third source electrode S3, and a third drain electrode D3. Here, the third source electrode S3 may have a same configuration as the first terminal of the third transistor T3 described with reference to FIG. 22, and the third drain electrode D3 may have a same configuration as the second terminal of the third transistor T3 described with reference to FIG. 22.

The first semiconductor pattern SCL1, the second semiconductor pattern SCL2, and the third semiconductor pattern SCL3 are disposed on the buffer layer BFL. Each of the first, second, and third semiconductor patterns SCL1, SCL2, and SCL3 may include a channel region, and a source region and a drain region positioned at respective sides of the channel region. The source regions of the first, second, and third semiconductor patterns SCL1, SCL2, and SCL3 may be electrically connected to the first, second, and third source electrodes S1, S2, and S3, respectively, and the drain regions of the first, second, and third semiconductor patterns SCL1, SCL2, and SCL3 may be electrically connected to the first, second, and third drain electrodes D1, D2, and D3, respectively.

The first, second, and third semiconductor patterns SCL1, SCL2, and SCL3 may include at least one of polysilicon, amorphous silicon, and an oxide semiconductor.

The first gate insulating layer GI1 may be disposed on the first semiconductor pattern SCL1, the second semiconductor pattern SCL2, the third semiconductor pattern SCL3, and the buffer layer BFL.

The driving gate electrode GA1, the switching gate electrode GA2, and the sensing gate electrode GA3 are disposed on the first gate insulating layer GI1. The driving gate electrode GA1, the switching gate electrode GA2, and the sensing gate electrode GA3 are disposed to overlap the channel regions of the first semiconductor pattern SCL1, the second semiconductor pattern SCL2, and the third semiconductor pattern SCL3, respectively.

The second gate insulating layer GI2 may be disposed on the driving gate electrode GA1, the switching gate electrode GA2, the sensing gate electrode GA3, and the first gate insulating layer GI1.

The first storage electrode CE1 may be disposed on the second gate insulating layer GI2, and disposed to overlap the driving gate electrode GA1. Here, the driving gate electrode GA1 may be implemented as a second storage electrode, and the first storage electrode CE1 and the driving gate electrode GA1 may overlap each other to form the storage capacitor Cst (see FIG. 22).

The interlayer insulating layer ILD may be disposed on the first storage electrode CE1 and the second gate insulating layer GI2.

The first source electrode S1, the first drain electrode D1, the second source electrode S2, the second drain electrode D2, the third source electrode S3, and the third drain electrode D3 are disposed on the interlayer insulating layer ILD.

The source drain electrode SD may be disposed on the interlayer insulating layer ILD, and disposed to at least partially overlap the first storage electrode CE1. The source drain electrode SD may be electrically connected to the first storage electrode CE1 through a contact hole of the interlayer insulating layer ILD. The source drain electrode SD may correspond to a partial configuration of the second terminal of the third transistor T3.

The first via layer VIA1 may be disposed on the first source electrode S1, the first drain electrode D1, the second source electrode S2, the second drain electrode D2, the third source electrode S3, the third drain electrode D3, the source drain electrode SD, and the interlayer insulating layer ILD.

The bridge electrode BRD may be disposed on the first via layer VIAL The bridge electrode BRD may be physically and/or electrically connected to the third drain electrode D3 of the third transistor T3 through a contact hole of the first via layer VIA1.

The data wire DL may be disposed on the first via layer VIA1. The data wire DL may be physically and/or electrically connected to the second source electrode S2 of the second transistor T2 through the contact hole of the first via layer VIA1. Here, the data wire DL may have a same configuration as the k-th data line Dk described with reference to FIG. 22.

The second via layer VIA2 may be disposed on the first via layer VIA1, the bridge electrode BRD, and the data wire DL.

The display element layer DPL may include the first electrode EL1, the light emitting element LD, and the protective layer PVX.

The first electrode EL1 may be disposed on the second via layer VIA2. The first electrode EL1 may be disposed on the pixel circuit layer PCL. The first electrode EL1 may be physically and/or electrically connected to the bridge electrode BRD through a contact hole of the second via layer VIA2.

The first electrode EL1 may include the first area electrode EL12a and the second area electrode EL12b. Here, the first area electrode EL12a and the second area electrode EL12b may have a same configuration as the first area electrode EL12a and the second area electrode EL12b described with reference to FIG. 10.

The light emitting element LD may be disposed on the first electrode EL1 and bonded to the first electrode ELL The bonding electrode CP (see FIG. 8) may be disposed between the light emitting element LD and the first electrode EL1.

The protective layer PVX may be disposed on the second via layer VIA2 and a portion of the first electrode EL1.

The second electrode EL2 (see FIG. 8) may be disposed on the light emitting element LD, the protective layer PVX, and the upper surface of the first electrode ELL The second electrode EL2 may be disposed to entirely cover or overlap the first pixel area PXA12a and the second pixel area PXA12b.

Since the display device according to an embodiment may include the first electrode divided into area electrodes in one pixel, the pixel areas corresponding to respective area electrodes may be sequentially or simultaneously driven. Accordingly, an amount of current applied to each pixel area may be adjusted, and power consumption of the display device may be adjusted.

Figure 24:
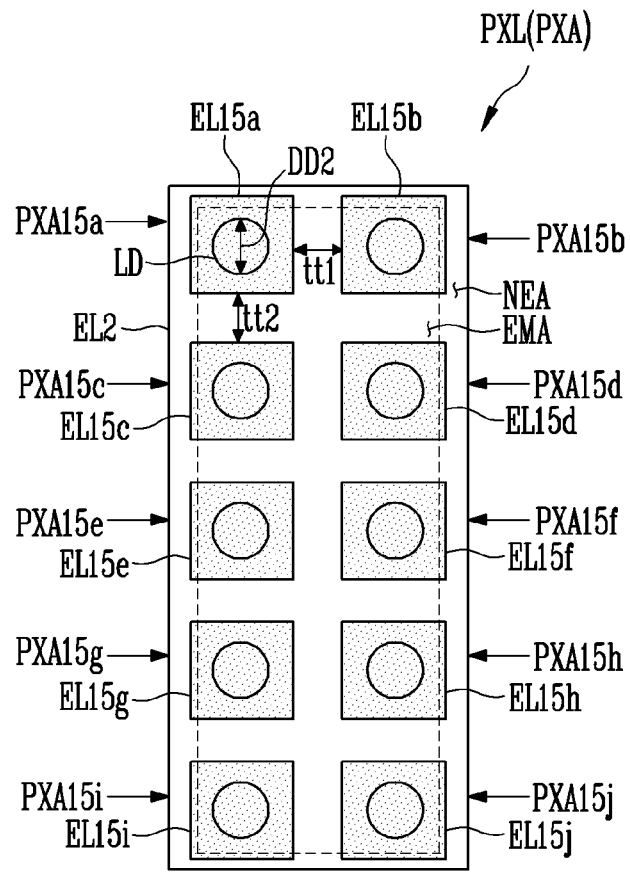
FIG. 24 illustrates a schematic top plan view of a display device according to an embodiment.

FIG. 24 illustrates a schematic top plan view of a display device according to an embodiment. FIG. 24 illustrates the display device similar to the display device shown in FIG. 10 described above, thus descriptions overlapping those of FIG. 10 will be omitted below.

Referring to FIG. 24, one pixel PXL (or, one pixel area PXA) may include a first pixel area PXA15a, a second pixel area PXA15b, and a third pixel area PXA15c, a fourth pixel area PXA15d, a fifth pixel area PXA15e, a sixth pixel area PXA15f, a seventh pixel area PXA15g, an eighth pixel area PXA15h, a ninth pixel area PXA15i, and a tenth pixel area PXA15j.

The first area electrode EL15a and the second area electrode EL15b are disposed to be spaced apart from each other along the first direction DR1, and a distance tt1 between the first area electrode EL15a and the second area electrode EL15b may be smaller than the diameter DD2 of the light emitting element LD.

The first area electrode EL15a and the third area electrode EL15c are disposed to be spaced apart from each other along the second direction DR2, and a distance tt2 between the first area electrode EL15a and the third area electrode EL15c may be smaller than the diameter DD2 of the light emitting element LD. Also included in FIG. 24, are a fourth area electrode EL15d, a fifth area electrode EL15e, a sixth area electrode EL15f, a seventh area electrode EL15g, an eighth area electrode EL15h, a nineth area electrode EL15i, and a tenth area electrode EL15j.

In an embodiment, by implementing the distances between the area electrodes adjacent to each other in the first direction DR1 and the second direction DR2 to be smaller than the diameter DD2 of the light emitting element LD, even in case that the light emitting element LD may be disposed between the area electrodes, since a voltage may be supplied to the light emitting element LD, a decrease in luminance of the display device may be prevented.

Hereinafter, a structure of the display device will be described with reference to FIG. 25 and FIG. 26.

Figure 25:
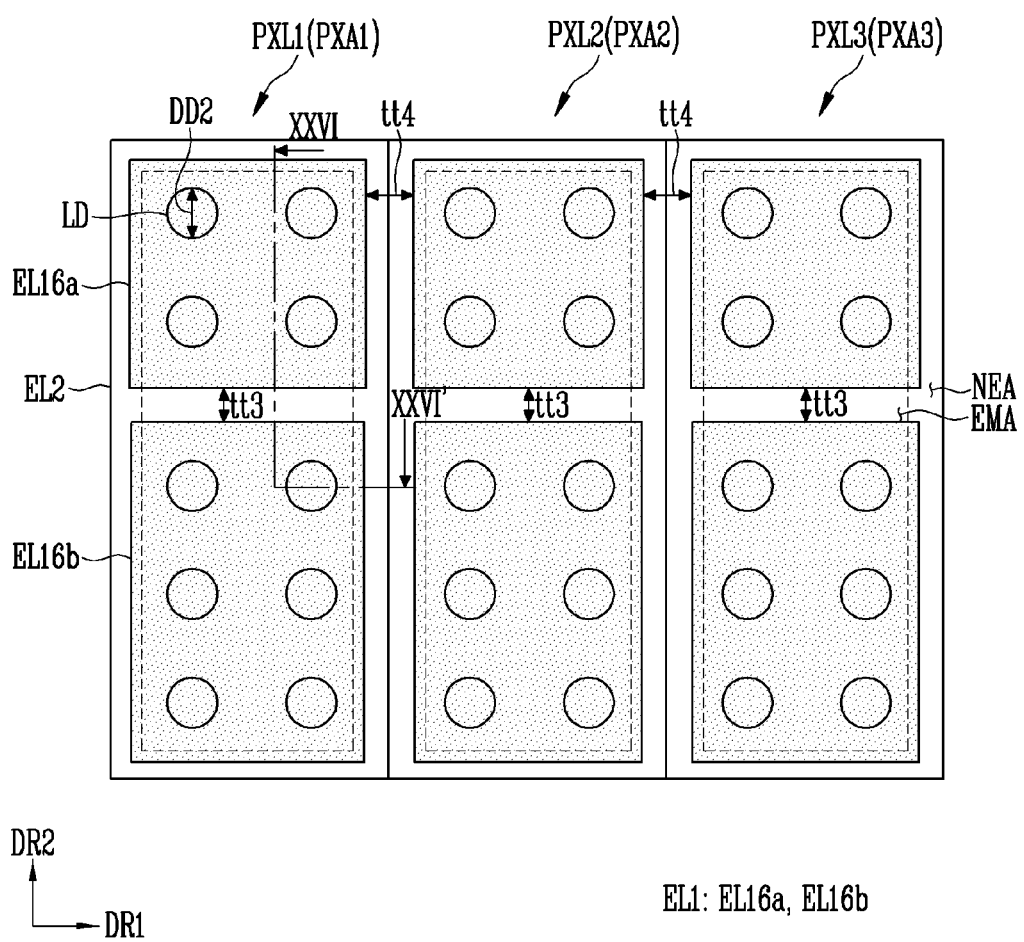
FIG. 25 illustrates a schematic top plan view of pixels of a display device according to an embodiment.

FIG. 25 illustrates a schematic top plan view of pixels of a display device according to an embodiment.

Referring to FIG. FIG. 25, the first pixel PXL1, the second pixel PXL2, and the third pixel PXL3 are disposed to be adjacent to each other along the first direction DR1.

The first pixel PXL1, the second pixel PXL2, and the third pixel PXL3 may each include the first electrode EL1, and the first electrode EL1 may include a first area electrode EL16a and a second area electrode EL16b disposed to be spaced apart from each other along the second direction DR2. The first pixel PXL1, the second pixel PXL2, and the third pixel PXL3, may respectively correspond to a first pixel area (PXA1), a second pixel area (PXA2), and a third pixel area (PXA3), but the disclosure is not limited thereto.

A distance tt3 between the first area electrode EL16a and the second area electrode EL16b may be smaller than the diameter DD2 of the light emitting element LD. Accordingly, in an embodiment, even in case that the light emitting element LD may be disposed between the area electrodes, a voltage may be supplied to the light emitting element LD, so that deterioration of the luminance of the display device may be prevented.

The first area electrodes EL16a of the first, second, and third pixels PXL1, PXL2, and PXL3 may be disposed to be spaced apart from each other along the first direction DR1, respectively.

A distance tt4 between the first area electrode EL16a of the first pixel PXL1 and the first area electrode EL16a of the second pixel PXL2 may be greater than the diameter DD2 of the light emitting element LD. Accordingly, even in case that the light emitting element LD may be disposed between the first area electrode EL16a of the first pixel PXL1 and the first area electrode EL16a of the second pixel PXL2, the same voltage is applied to the first area electrodes EL16a of respective pixels, so a short circuit defect may be prevented.

Figure 26:
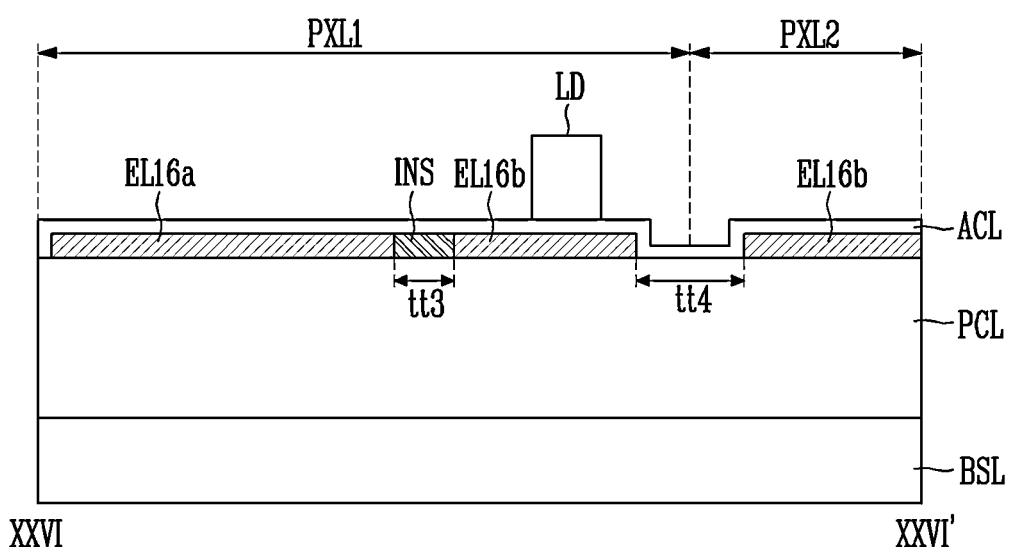
FIG. 26 illustrates a schematic cross-sectional view taken along line XXVI-XXVI' of FIG. 25.

FIG. 26 illustrates a schematic cross-sectional view taken along line XXVI-XXVI' of FIG. 25. FIG. 26 illustrates the first electrode EL1, the insulating layer INS, an auxiliary adhesive layer ACL, and the light emitting element LD for a brief description.

Referring to FIG. 26, the first area electrode EL16a and the second area electrode EL16b of the first pixel PXL1 are disposed on the pixel circuit layer PCL. The second area electrode EL16b of the second pixel PXL2 may be disposed on the pixel circuit layer PCL.

The insulating layer INS may be disposed between the first area electrode EL16a and the second area electrode EL16b of the first pixel PXL1. The insulating layer INS is a layer to compensate for a step between the first area electrode EL16a and the second area electrode EL16b spaced apart from each other in one pixel. The insulating layer INS may include an inorganic insulating material or an organic insulating material. A height of an upper surface of the insulating layer INS may be the same as or similar to that of upper surfaces of the first area electrode EL16a and the second area electrode EL16b.

In an embodiment, by disposing the insulating layer INS between the area electrodes of one pixel, in case that disposing the light emitting element LD, a bonding defect due to the step between the area electrodes may be minimized. By disposing the insulating layer INS between the area electrodes spaced apart from each other in one pixel, the height of the upper surfaces of the area electrodes and the height of the upper surface of the insulating layer INS may be implemented to be the same or similar, and in case that disposing the light emitting element LD, it is possible to minimize the bonding defect due to the step between the area electrodes.

In an embodiment, by disposing the insulating layer INS between the area electrodes of one pixel, it is possible to minimize the short circuit defect between the area electrodes spaced apart from each other in one pixel.

The auxiliary adhesive layer ACL may be disposed on the first area electrode EL16a and the second area electrode EL16b. The auxiliary adhesive layer ACL may electrically connect the first electrode EL1 and the light emitting element LD.

The auxiliary adhesive layer ACL may include an adhesive material capable of bonding the first electrode EL1 and the light emitting element LD, and for example, the auxiliary adhesive layer ACL may include a material such as flux. The auxiliary adhesive layer ACL may remove oxide films of the first electrode EL1 and/or the light emitting element LD to improve bonding force between metals. The disclosure is not limited thereto, and in an embodiment, the auxiliary adhesive layer ACL may be omitted, and the first electrode EL1 and the light emitting element LD may be bonded by another bonding metal layer.

While the disclosure has been shown and described with reference to embodiments thereof, it will be understood by those skilled in the art that various changes in forms and details may be made therein without departing from the spirit and scope of the disclosure as defined by the appended claims and their equivalents.

Therefore, the spirit and scope of the disclosure may be determined by the spirit and scope of the accompanying claims.

What is claimed is:

1. A display device comprising:
   a pixel, wherein
   the pixel includes:
   at least one light emitting element including a first end and a second end;
   a bonding electrode;
   a first electrode overlapping the at least one light emitting element and electrically connected to the first end of the at least one light emitting element via the bonding electrode, the bonding electrode disposed between the first electrode and the first end of the at least one light emitting element; and
   a second electrode overlapping the at least one light emitting element and the first electrode and electrically connected to the second end of the at least one light emitting element, and
   the first electrode includes area electrodes divided according to a number and a position of area electrodes overlapping the at least one light emitting element.

2. The display device of claim 1, wherein
the bonding electrode includes a metal selected from the group consisting of Copper, Gold, and Tin.

3. The display device of claim 2, wherein the bonding electrode is made of a same material as the first electrode.

4. The display device of claim 3, wherein
the pixel includes a first pixel area, a second pixel area, and a third pixel area; and
the first pixel area, the second pixel area, and the third pixel area are adjacent to each other in a vertical direction.

5. The display device of claim 4, wherein
the first electrode includes a first area electrode, a second area electrode, and a third area electrode; and
a number of the at least one light emitting element overlapping the first area electrode is different from a number of the at least one light emitting element overlapping the second area electrode.

6. The display device of claim 5, wherein the first area electrode, the second area electrode, and the third area electrode have different sizes.

7. The display device of claim 5, wherein the first area electrode, the second area electrode, and the third area electrode have a same shape or different shapes.

8. The display device of claim 3, wherein
the pixel includes a first pixel area, a second pixel area, a third pixel area, a fourth pixel area, a fifth pixel area, a sixth pixel area, a seventh pixel area, an eighth pixel area, a ninth pixel area, and a tenth pixel area; and
the first pixel area, the second pixel area, the third pixel area, the fourth pixel area, the fifth pixel area, the sixth pixel area, the seventh pixel area, the eighth pixel area, the ninth pixel area, and the tenth pixel area are disposed adjacent in a matrix.

9. The display device of claim 8, wherein
the first electrode includes a first area electrode, a second area electrode, a third area electrode, a fourth area electrode, a fifth area electrode, a sixth area electrode, a seventh area electrode, an eighth area electrode, a ninth area electrode, and a tenth area electrode; and
the first area electrode, the second area electrode, the third area electrode, the fourth area electrode, the fifth area electrode, the sixth area electrode, the seventh area electrode, the eighth area electrode, the ninth area electrode, and the tenth area electrode are spaced apart from each other in a matrix.

10. The display device of claim 3, wherein
the pixel includes a first pixel area and a second pixel area, and
the first pixel area and the second pixel area are adjacent to each other in a horizontal direction.

11. The display device of claim 10, wherein
the first electrode includes a first area electrode and a second area electrode, and
a number of the at least one light emitting element overlapping the first area electrode is equal to a number of the at least one light emitting element overlapping the second area electrode.

12. The display device of claim 3, wherein
the pixel includes a first pixel area and a second pixel area, and
the first pixel area and the second pixel area are adjacent to each other in a vertical direction.

13. The display device of claim 12, wherein
the first electrode includes a first area electrode and a second area electrode, and
a number of the at least one light emitting element overlapping the first area electrode is different from a number of the at least one light emitting element overlapping the second area electrode.

14. A display device comprising:
a pixel, wherein
the pixel includes:
   at least one light emitting element including a first end and a second end;
   a bonding electrode;
   a first electrode overlapping the at least one light emitting element and electrically connected to the first end of the at least one light emitting element via the bonding electrode, the bonding electrode disposed between the first electrode and the first end of the at least one light emitting element; and
   a second electrode overlapping the at least one light emitting element and the first electrode and electrically connected to the second end of the at least one light emitting element, and
the first electrode includes area electrodes divided according to a number and a position of area electrodes overlapping the at least one light emitting element;
the pixel includes pixel areas, and the area electrodes correspond to the pixel areas; and the at least one light emitting element is disposed in a zigzag pattern.

15. The display device of claim 14, wherein
the bonding electrode includes a metal selected from the group consisting of Copper, Gold, and Tin.

16. The display device of claim 15, wherein the bonding electrode is made of a same material as the first electrode.

17. The display device of claim 14, wherein
the first electrode includes a first area electrode, a second area electrode, and a third area electrode, and
the first area electrode, the second area electrode, and the third area electrode have different sizes.

18. The display device of claim 14, wherein
the bonding electrode is made of a same material as the first electrode.

19. The display device of claim 18, wherein
a number of the at least one light emitting element overlapping the first area electrode is different from a number of the at least one light emitting element overlapping the second area electrode.

20. A display device comprising:
pixels, wherein
each of the pixels includes:
at least one light emitting element including a first end and a second end;
a bonding electrode; and
a first electrode overlapping the at least one light emitting element and electrically connected to the first end of the at least one light emitting element via the bonding electrode, the bonding electrode disposed between the first electrode and the first end of the at least one light emitting element via the bonding electrode, the bonding electrode disposed between the first electrode and the first end of the at least one light emitting element, and
the first electrode includes area electrodes divided according to a number and a position of area electrodes overlapping the at least one light emitting element; and
a distance between the area electrodes is smaller than a diameter of the at least one light emitting element.

21. The display device of claim 20, wherein
the first electrode includes a first area electrode, a second area electrode, and a third area electrode, and
the first area electrode, the second area electrode, and the third area electrode have different sizes.

22. The display device of claim 20, further comprising an insulating layer disposed between the area electrodes.

23. The display device of claim 22, further comprising:
an auxiliary adhesive layer disposed on the first electrode and the insulating layer.

* * * * *